(12) United States Patent
Tsai et al.

(10) Patent No.: US 12,051,632 B2
(45) Date of Patent: Jul. 30, 2024

(54) SEMICONDUCTOR PACKAGE STRUCTURE AND METHOD FOR FORMING SEMICONDUCTOR PACKAGE STRUCTURE

(71) Applicant: Taiwan Semiconductor Manufacturing Company, Ltd., Hsinchu (TW)

(72) Inventors: Po-Hao Tsai, Taoyuan (TW); Wei-Hung Lin, Xinfeng Township, Hsinchu County (TW); Ming-Da Cheng, Taoyuan (TW); Mirng-Ji Lii, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 341 days.

(21) Appl. No.: 17/460,868

(22) Filed: Aug. 30, 2021

(65) Prior Publication Data
US 2023/0062138 A1    Mar. 2, 2023

(51) Int. Cl.
| | | |
|---|---|---|
| *H01L 23/31* | (2006.01) | |
| *H01L 21/48* | (2006.01) | |
| *H01L 23/498* | (2006.01) | |
| *H01L 25/18* | (2023.01) | |

(52) U.S. Cl.
CPC ...... *H01L 23/3121* (2013.01); *H01L 21/4857* (2013.01); *H01L 21/486* (2013.01); *H01L 23/49822* (2013.01); *H01L 23/49827* (2013.01); *H01L 23/49833* (2013.01); *H01L 25/18* (2013.01)

(58) Field of Classification Search
None
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |

(Continued)

FOREIGN PATENT DOCUMENTS

| | | | | |
|---|---|---|---|---|
| EP | 3503171 A1 * | 6/2019 | ......... | H01L 21/4853 |
| TW | 202018891 A | 5/2020 | | |

OTHER PUBLICATIONS

Chinese language office action dated Mar. 29, 2023, issued in application No. TW 111112967.

*Primary Examiner* — Scott B Geyer
(74) *Attorney, Agent, or Firm* — McClure, Qualey & Rodack, LLP

(57) ABSTRACT

A semiconductor package structure includes first via structures formed through a core substrate. The structure also includes an interposer embedded in the core substrate between the first via structures. The interposer includes second via structures formed through an interposer substrate. The structure also includes a first redistribution layer structure formed over the core substrate. The structure also includes a second redistribution layer structure formed under the core substrate. The structure also includes a first encapsulating layer formed between a sidewall of the interposer and a sidewall of the core substrate.

20 Claims, 22 Drawing Sheets

(56) References Cited

U.S. PATENT DOCUMENTS

| | | | |
|---|---|---|---|
| 9,281,254 B2 | 3/2016 | Yu et al. | |
| 9,368,460 B2 | 6/2016 | Yu et al. | |
| 9,372,206 B2 | 6/2016 | Wu et al. | |
| 9,385,056 B2* | 7/2016 | Hu | H01L 23/13 |
| 9,496,189 B2 | 11/2016 | Yu et al. | |
| 11,355,438 B2 | 6/2022 | Pietambaram et al. | |
| 11,923,257 B2* | 3/2024 | Starkston | H01L 23/5385 |
| 2006/0065972 A1* | 3/2006 | Khan | H01L 23/13 |
| | | | 257/E23.079 |
| 2009/0145636 A1* | 6/2009 | Miki | H01L 23/315 |
| | | | 174/255 |
| 2010/0081236 A1* | 4/2010 | Yang | H01L 24/94 |
| | | | 257/E21.511 |
| 2012/0146209 A1* | 6/2012 | Hu | H01L 24/19 |
| | | | 257/692 |
| 2013/0001798 A1* | 1/2013 | Choi | H01L 24/17 |
| | | | 257/774 |
| 2013/0032390 A1* | 2/2013 | Hu | H01L 23/49833 |
| | | | 174/266 |
| 2013/0214426 A1* | 8/2013 | Zhao | H01L 23/14 |
| | | | 257/774 |
| 2013/0337648 A1* | 12/2013 | Lin | H01L 23/5389 |
| | | | 438/675 |
| 2014/0246227 A1* | 9/2014 | Lin | H05K 3/4697 |
| | | | 174/266 |
| 2019/0164912 A1 | 5/2019 | Lee et al. | |
| 2019/0164938 A1* | 5/2019 | Lee | H01L 23/5384 |
| 2019/0280374 A1* | 9/2019 | Kim | H01Q 1/38 |
| 2020/0006307 A1* | 1/2020 | Tsai | H01L 21/6835 |
| 2020/0273840 A1* | 8/2020 | Elsherbini | H01L 23/13 |
| 2020/0286814 A1* | 9/2020 | Mahajan | H01L 21/565 |
| 2020/0365489 A1* | 11/2020 | Su | H01L 21/6835 |
| 2021/0134724 A1* | 5/2021 | Rubin | H01L 23/5385 |
| 2022/0045008 A1* | 2/2022 | Kang | H01L 21/4857 |
| 2022/0278032 A1* | 9/2022 | Pietambaram | H01L 23/5385 |
| 2022/0352076 A1* | 11/2022 | Ecton | H01L 23/5385 |

* cited by examiner

SEMICONDUCTOR PACKAGE STRUCTURE AND METHOD FOR FORMING SEMICONDUCTOR PACKAGE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
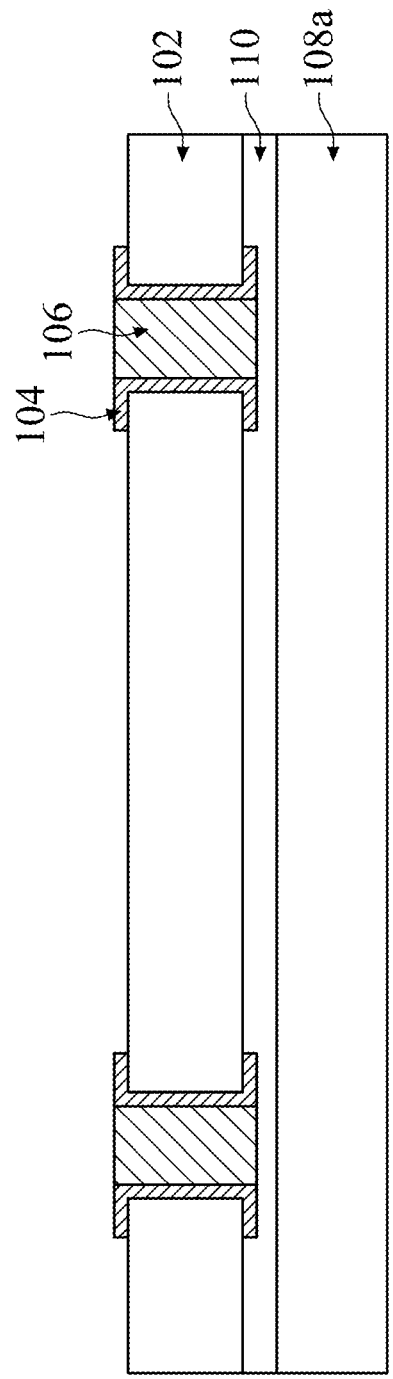
FIGS. 1A-1J are cross-sectional representations of various stages of forming a semiconductor package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor package structure are provided. The method for forming the semiconductor package structure may include disposing an interposer embedded in a core substrate. Since the pitch of the vias of the interposer and the pitch of the vias in the core substrate are different, a mixed pitch vertical connection may be achieved, and there may be more input/output (I/O) terminals for die integration, and the height of the semiconductor package structure may be reduced. In addition, the rigidity of the interposer substrate is higher than the core substrate, preventing warpage.

A core substrate 102 is provided, as shown in FIG. 1A in accordance with some embodiments. The core substrate 102 may be made of a pre-impregnated composite fiber ("prepreg"), an insulating film or build-up film, paper, glass fiber, non-woven glass fabric, silicon, or the like. The core substrate 102 may be made of a prepreg including glass fiber and a resin. The core substrate 102 may be a copper-clad epoxy-impregnated glass-cloth laminate, a copper-clad polyimide-impregnated glass-cloth laminate, or the like.

Next, openings may be formed through the core substrate 102 (not shown). The openings may define the position of the subsequently formed via structures. The openings may be formed by a laser drilling process. The openings may be formed by photolithography and etching process. The photolithography process may include photoresist coating (e.g. spin-on coating), soft baking, mask aligning, pattern exposure, post-exposure baking, photoresist development, and rinsing and drying (e.g. hard baking), etc. The etching process may include a dry etching process (e.g., reactive ion etching (RIE), anisotropic plasma etching method), a wet etching process, or a combination thereof.

Next, a plating layer 104 is formed over the sidewalls of the openings, as shown in FIG. 1A in accordance with some embodiments. The plating layer 104 may cover a portion of the top surface and the bottom surface of the core substrate 102 near the openings. The plating layer 104 may be formed by a plating process such as a chemical plating process. The plating layer 104 may be formed by electroless nickel immersion gold (ENIG), electroless nickel electroless palladium immersion gold (ENEPIG), copper, aluminum, other suitable materials, or a combination thereof.

Afterwards, the first via structure 106 is formed in the openings formed in the core substrate 102, as shown in FIG. 1A in accordance with some embodiments. The first via structure 106 may be filled into the openings. The first via structure 106 may be made of metal, such as copper (Cu), aluminum (Al), tungsten (W), nickel (Ni), alloy thereof, or a combination thereof. The first via structure 106 may be formed by a plating process such as an electroplating process. After the first via structure 106 is formed, the sidewalls of the first via structure 106 may be surrounded by the plating layer 104, as shown in FIG. 1A in accordance with some embodiments.

A first carrier substrate 108a is provided, as shown in FIG. 1A in accordance with some embodiments. The first carrier substrate 108a may provide temporary mechanical and structural support during subsequent processing steps. The first carrier substrate 108a may include glass, silicon, silicon oxide, aluminum oxide, metal, the like, or a combination thereof. The first carrier substrate 108a may include a metal frame.

Next, a buffer layer 110 is formed over the first carrier substrate 108a, and the core substrate 102 is bonded to the first carrier substrate 108a by the buffer layer 110, as shown in FIG. 1A in accordance with some embodiments. The buffer layer 110 may be a polymer-based layer. The buffer layer 110 may be made of a poly-p-phenylenebenzobisthiazole (PBO) layer, a polyimide (PI) layer, a solder resist (SR) layer, an Ajinomoto buildup film (ABF), a die attach film (DAF), other applicable materials, or combinations thereof.

Figure 1B:
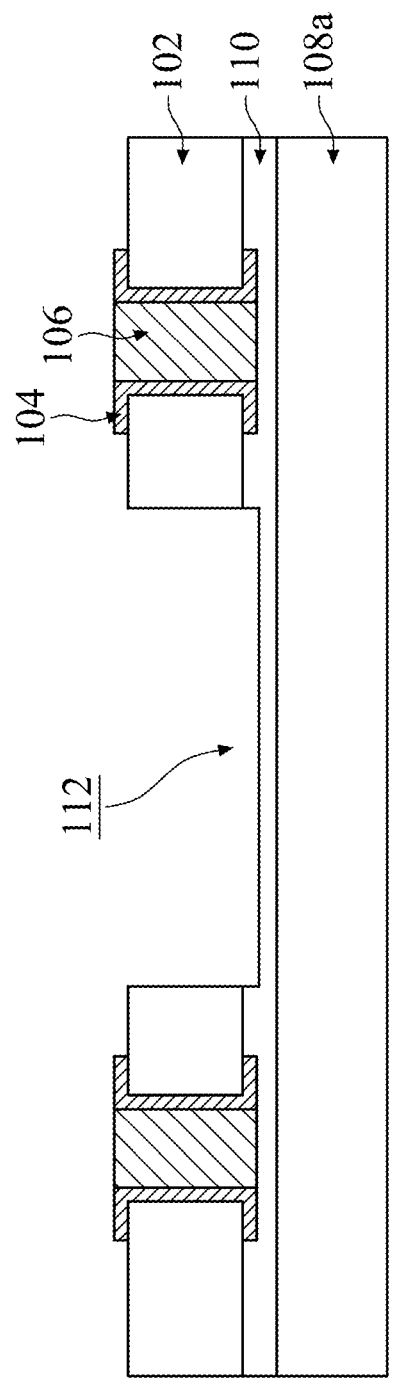

Next, a cavity 112 is formed in the core substrate 102 between the via structures 106, as shown in FIG. 1B in accordance with some embodiments. As shown in FIG. 1B, the buffer layer 110 is exposed from the cavity 112. The cavity 112 may be formed by a laser drilling process, an etching process, or other applicable processes, or a combination thereof.

Figure 1C:
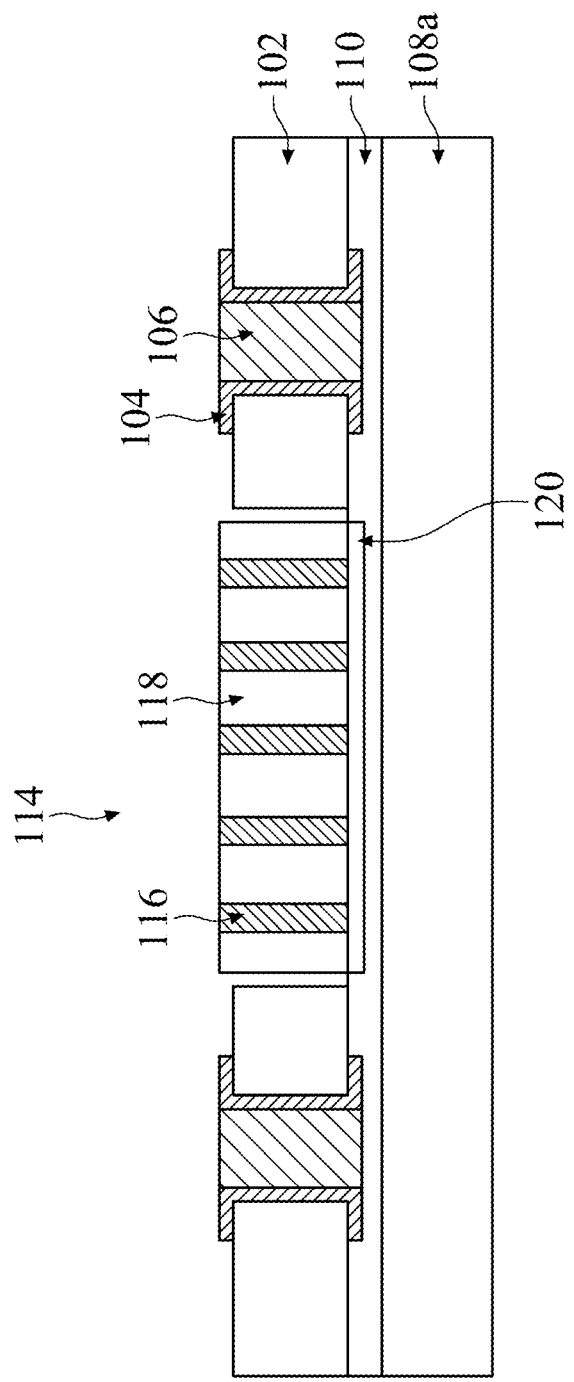

Next, an interposer 114, is provided as shown in FIG. 1C in accordance with some embodiments. In some embodiments, the interposer 114 includes second via structures 116 formed through the interposer substrate 118. The semiconductor material may include silicon or germanium. In some embodiments, the interposer substrate 118 is made of silicon. The interposer substrate 118 may be made of a fiber material, a polymer material, a semiconductor material, a glass material, a metal material, or suitable materials, or a combination thereof. The fiber material may include a glass fiber material. In some embodiments, the interposer substrate 118 and the core substrate 102 are made of different materials. In some embodiments, the rigidity of the interposer substrate 118 is greater than the rigidity of the core substrate 102. In some embodiments, the interposer substrate 118 is rigid and has a low coefficient of thermal expansion (CTE) of around 4 ppm.

The second via structures 116 may be formed by firstly forming openings in the interposer substrate 118 by an etching process (e.g., a reactive ion etching (RIE) process). A barrier layer may be formed on the sidewalls and the bottoms of the openings before filling the conductive material of the second via structures 116 to prevent the conductive material of the second via structures 116 from diffusing into the interposer substrate 118. The barrier layer may also serve as an adhesive or glue layer. The material of the barrier layer may be TiN, Ti, Ta, TaN, W, WN, other applicable materials, or a combination thereof. The barrier layer may be formed by depositing the barrier layer materials by a physical vapor deposition process (PVD) (e.g., evaporation or sputtering), an atomic layer deposition process (ALD), an electroplating process, other applicable processes, or a combination thereof.

The second via structures 116 may include copper, polysilicon, tungsten, other conductive material, or a combination thereof. The openings may be filled with conductive material by deposition process such as a sub-atmospheric chemical vapor deposition (SACVD) process, a physical vapor deposition (PVD) process, an atomic layer deposition (ALD) process, or a combination thereof. The second via structures 116 may also be referred to as through substrate vias (TSVs) 116.

Next, the interposer 114 is disposed over the buffer layer 110 over the first carrier substrate 108a, as shown in FIG. 1C in accordance with some embodiments. The interposer 114 may be formed between the first via structures 106. As shown in FIG. 1C, the interposer 114 is disposed over the buffer layer 110 by an adhesive layer 120. The adhesive layer 120 may be a die attach film (DAF). The interposer 114 may be placed in the cavity 112 by a pick-and-place machine process. As shown in FIG. 1C, in some embodiments the cavity 112 is wider than the interposer 114. Therefore, there may be a gap between the sidewall of the interposer 114 and the sidewall of the core substrate 102. As shown in FIG. 1C, in some embodiments, the height of the interposer 114 is greater than the height of the core substrate 102.

Figure 1D:
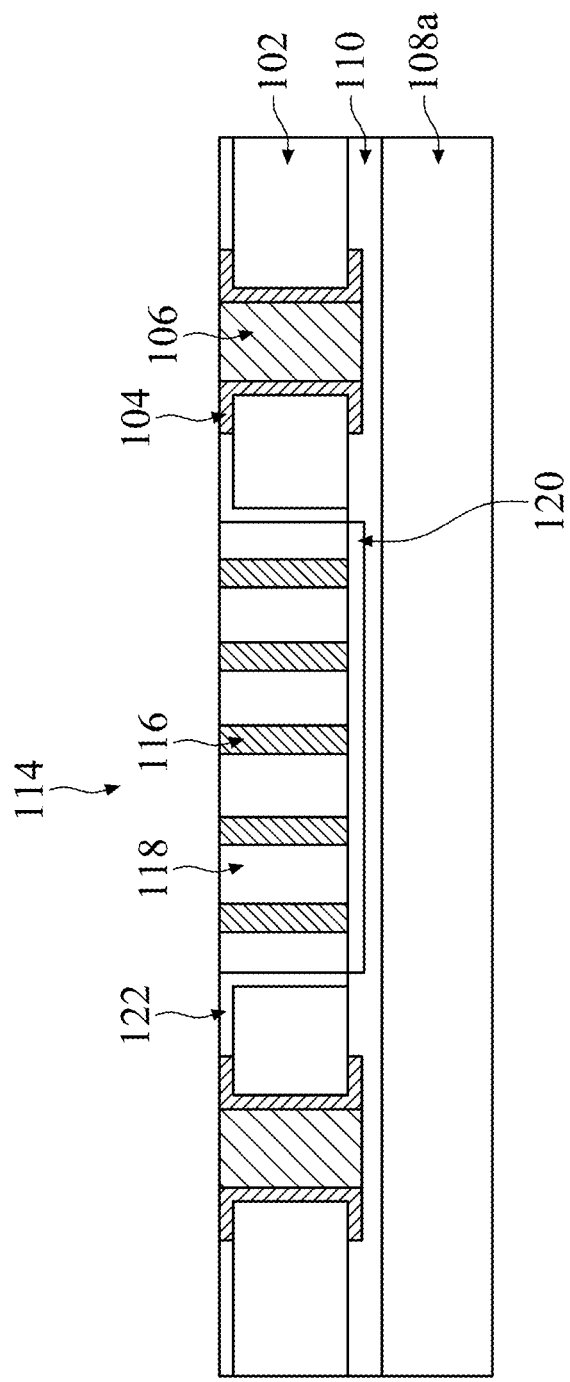

Next, a first encapsulating material 122 is filled surrounding the interposer 114 and over the core substrate 102, as shown in FIG. 1D in accordance with some embodiments. The first encapsulating material 122 may include a molding compound, such as liquid epoxy, deformable gel, silicon rubber, or the like. The first encapsulating material 122 may provide mechanical support and electrical isolation to the first via structure 106, and protection to the active circuitry from the environment. The first encapsulating material 122 may be dispensed over the core substrate 102 and in the gap between the core substrate 102 and the interposer 114 by a capillary flow process. Next, the first encapsulating material 122 may be cured by a thermal curing process, an infrared (IR) energy curing process, a UV curing process, or a combination thereof.

Afterwards, a planarization process is performed on the first encapsulating material 122 to expose the interposer 114 and the first via structure 106, as shown in FIG. 1D, in accordance with some embodiments of the disclosure. After the planarization process, the via structures 106 and 116 may be exposed, and the top surface of the interposer 114 may be substantially level with the top surface of the first via structure 106. The top surface of the interposer 114 may be substantially level with the top surface of the first encapsulating material 122 covering the core substrate 102. As shown in FIG. 1D, the first encapsulating material 122 is formed between the sidewall of the interposer 114 and the sidewall of the core substrate 102. Since the interposer 114 is higher than the core substrate 102, the first encapsulating material 122 also covers a portion of the top surface of the core substrate 102. The planarization process may include grinding process, a chemical mechanical polishing (CMP) process, an etching process, other applicable processes or combinations thereof.

Figure 1E:
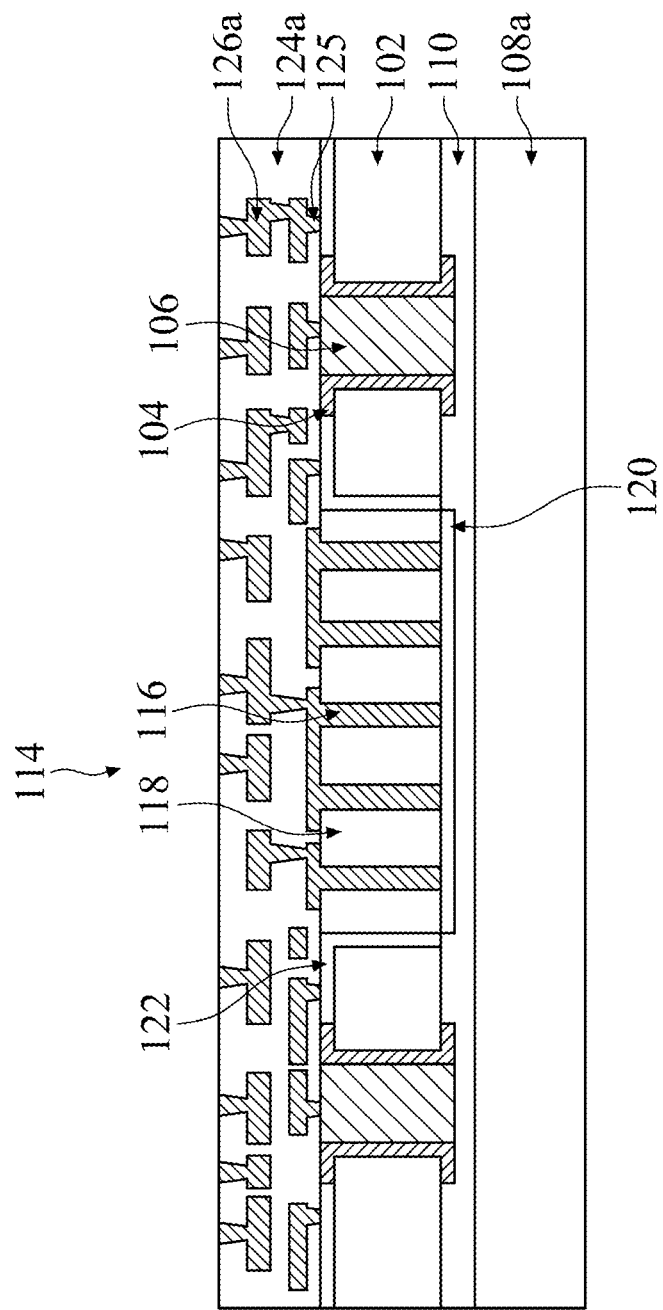
Figure 2:
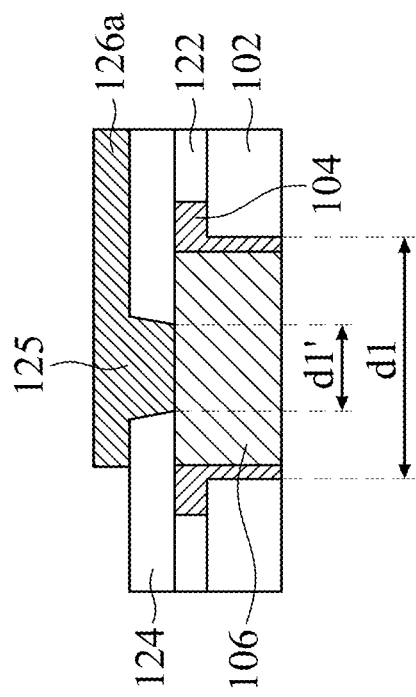
FIG. 2 is an enlarged cross-sectional view of a semiconductor package structure, in accordance with some embodiments of the disclosure.
Figure 3:
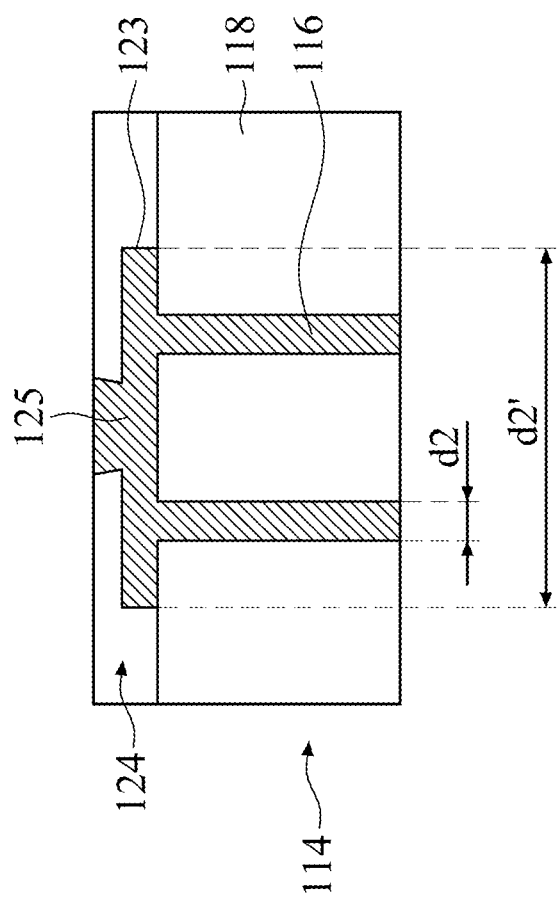
FIG. 3 is an enlarged cross-sectional view of a semiconductor package structure, in accordance with some embodiments of the disclosure.

Next, a first redistribution layer structure (RDL) 126a, including redistribution layer (RDL) pads and RDL via structure 125, is formed, as shown in FIGS. 1E, 2 and 3. FIGS. 2 and 3 are enlarged cross-sectional views of the semiconductor package structure, in accordance with some embodiments of the disclosure.

First, a conductive layer (not shown) is formed over the core substrate 102 and the interposer 114. The conductive layer may be made of metal material such as aluminum (Al), copper (Cu), tungsten (W), gold (Au), other suitable materials, or a combination thereof. The conductive layer may be deposited by an electroplating process, a sputtering process, another applicable process, or a combination thereof. Afterwards, one or multiple etching processes may be used to pattern the conductive layer to form redistribution layer (RDL) pads 123, as shown in FIG. 3, in accordance with some embodiments of the disclosure.

Next, a passivation layer 124 may be formed over the RDL pads 123, the core substrate 102, and the interposer 114, as shown in FIG. 3 in accordance with some embodiments of the disclosure. The passivation layer 124 may be conformally formed over the RDL pads 123, the core substrate 102, and the interposer 114 first. The passivation layer 124 may be made of polymer material such as polyimide, polybenzoxazole (PBO), benzocyclobutene (BCB), silicone, acrylates, siloxane, other suitable materials, or a combination thereof. The passivation layer 124 may also include non-organic materials such as silicon oxide, un-doped silicate glass, silicon oxynitride, solder resist (SR), silicon nitride, silicon carbide, hexamethyldisilazane (HMDS), other suitable materials, or a combination thereof. The passivation layer 124 may be deposited by a chemical vapor deposition (CVD) process or a spin-on coating process.

Next, the passivation layer 124 may be patterned to form openings exposing the underlying RDL pads 123 (not shown). The openings may be formed by photolithography and etching process. The photolithography process may include photoresist coating (e.g. spin-on coating), soft baking, mask aligning, pattern exposure, post-exposure baking, photoresist development, and rinsing and drying (e.g. hard baking), etc. The etching process may include a dry etching process (e.g., reactive ion etching (RIE), anisotropic plasma etching method), a wet etching process, or a combination thereof.

Afterwards, the RDL via structure 125 is formed in the opening over the RDL pads 123, as shown in FIGS. 2 and 3 in accordance with some embodiments. The RDL via structure 125 may be formed by a chemical vapor deposition process (CVD), a physical vapor deposition process (PVD) (e.g., evaporation or sputter), an atomic layer deposition process (ALD), an electroplating process, another suitable process, or a combination thereof to deposit the conductive materials of the RDL via structure 125, and then a planarization process such as a chemical mechanical polishing (CMP) process or an etch back process is optionally performed to remove excess conductive materials. The RDL via structure 125 may include copper, aluminum, electroless nickel immersion gold (ENIG), electroless nickel electroless palladium immersion gold (ENEPIG), other suitable materials, or a combination thereof. In some embodiments, the RDL via structure 125 is made of copper. The RDL via structure 125 may be in contact with the via structures 106 and 116. In some embodiments, the RDL via structure 125 is electrical connected to the via structures 106 and 116.

Next, a polymer layer 124a is formed over the interposer 114 and the core substrate 102, as shown in FIG. 1E in accordance with some embodiments of the disclosure. Openings are formed in the polymer layer 124a to expose the RDL via structure 125. Afterwards, a first redistribution layer structure (RDL) 126a may be formed over the polymer layer 124a and in the openings in the polymer layer 124a. Therefore, the first redistribution layer structure 126a including the RDL pads and RDL via structure 125 may be in contact with the via structures 106 and 116, and the first redistribution layer structure 126a is electrically connected to the via structures 106 and 116. In addition, the first redistribution layer structure 126a may be routed on the core substrate 102 and the interposer 114. In addition, the first encapsulating layer 122 is formed between the first redistribution layer structure 126a and the core substrate 102.

The polymer layer 124a may be made of polybenzoxazole (PBO), benzocyclobutene (BCB), silicone, acrylates, siloxane, or combinations thereof. The polymer layer 124a may be made of non-organic materials, such as silicon oxide, un-doped silicate glass, silicon oxynitride, solder resist (SR), silicon nitride, HMDS (hexamethyldisilazane).

The first redistribution layer structure 126a may be made of metal such as copper (Cu), copper alloy, aluminum (Al), aluminum alloy, tungsten (W), tungsten alloy, titanium (Ti), titanium alloy, tantalum (Ta), or tantalum alloy. The first redistribution layer structure 126a may be formed by plating, electroless plating, sputtering or chemical vapor deposition (CVD). In some embodiments, the first redistribution layer structure 126a and the first via structure 106 are formed by the same material. In some embodiments, the first redistribution layer structure 126a is made of copper.

As shown in FIG. 1E, the polymer layer 124a and the first redistribution layer structure 126a are repeated formed. Therefore, multiple redistribution layer structures 126a may be formed over the interposer 114 and the core substrate 102. It should be noted that the number of layers of the polymer layer 124a and the first redistribution layer structure 126a shown in FIG. 1E is merely an example, and the present disclosure is not limited thereto.

Next, an under bump metallurgy (UBM, not shown) may be formed through or on the top polymer layer 124a, providing electrical connection between the first redistribution layer structure 126a and subsequently formed electrical connector. The UBM may have a solderable metal surface to serve as an interface between a solder bump and the first redistribution layer structure 126a. The UBM may be made of metal such as copper, nickel, titanium, tungsten, aluminum, other suitable conductive materials, or a combination thereof. The UBM may be formed by plating, such as electroplating or electroless plating, other suitable process, or a combination thereof.

Figure 1F:
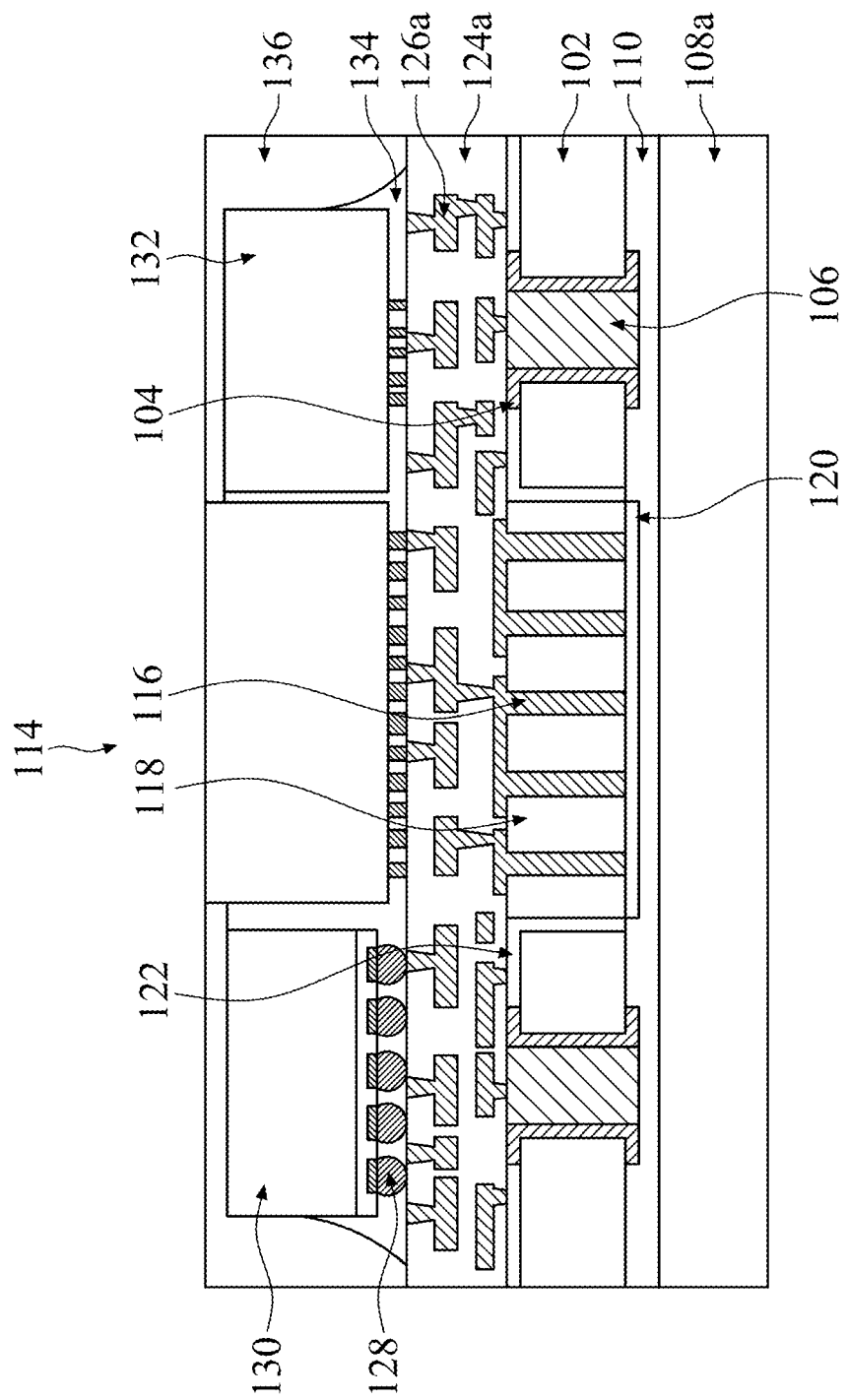

Afterwards, a first electrical connector 128 is formed over the polymer layer 124a, as shown in FIG. 1F in accordance with some embodiments. The first electrical connector 128 may include solder ball, metal pillar, other applicable connectors, or a combination thereof. The under bump metallurgy (UBM) may be formed between the first electrical connector 128 and the first redistribution layer structure 126a as an interface.

Afterwards, a package 130 and a chip 132 may be bonded to the first electrical connector 128. The package 130 may include a packaged die, an interposer, an antenna-in-package (AIP), a micro-electro-mechanical system (MEMS) package, or a combination thereof. The chip 132 may include memory dies, such as Static Random Access Memory (SRAM) die, Dynamic Random Access Memory (DRAM) die, an integrated passive device (IPD), or the like.

It should be noted that the number of the package 130 and the chip 132 shown in FIG. 1F is merely an example, and the present disclosure is not limited thereto. There may be any number of package 130 and the chip 132, depending on the needs of packaging.

Afterwards, an underfill layer 134 is filled between the package 130 and the chip 132 as shown in FIG. 1F in accordance with some embodiments. As shown in FIG. 1F, the underfill layer 134 surrounds the package 130 and the chip 132, and the first electrical connector 128 connecting package 130 and the chip 132 and the first redistribution layer structure 126a. The underfill layer 134 may include an underfill material, such as epoxy resin, a polymer material, or a filler material. The underfill layer 134 may provide mechanical support and electrical isolation to the first electrical connector 128, and protection to the active circuitry from the environment. The underfill layer 134 may be formed by a capillary flow process.

Afterwards, a second encapsulating material 136 is formed over the package 130 or a chip 132, as shown in FIG. 1F in accordance with some embodiments. The second encapsulating material 136 may cover and surrounds the package 130 and the chip 132. The second encapsulating material 136 may also cover the first redistribution layer structure 126a. The forming processes and material for forming the second encapsulating material 136 may be the same as, or similar to, those used when forming the first encapsulating material 122. For the purpose of brevity, the descriptions of these processes are not repeated herein. The material of the first encapsulating material 122 and the second encapsulating material 136 may be the same.

After the second encapsulating material 136 is deposited, a planarization process is performed to expose the package 130 and the chip 132, as shown in FIG. 1F, in accordance with some embodiments of the disclosure. After the planarization process, the top surface of the package 130 and the chip 132 may be substantially level with the top surface of the second encapsulating material 136. In addition, the top surface of the package 130 and the chip 132 may be exposed. As shown in FIG. 1F, the underfill layer 134 is surrounded by the second encapsulating material 136. The planarization process may include grinding process, a chemical mechanical polishing (CMP) process, an etching process, other applicable processes or combinations thereof.

Figure 1G:
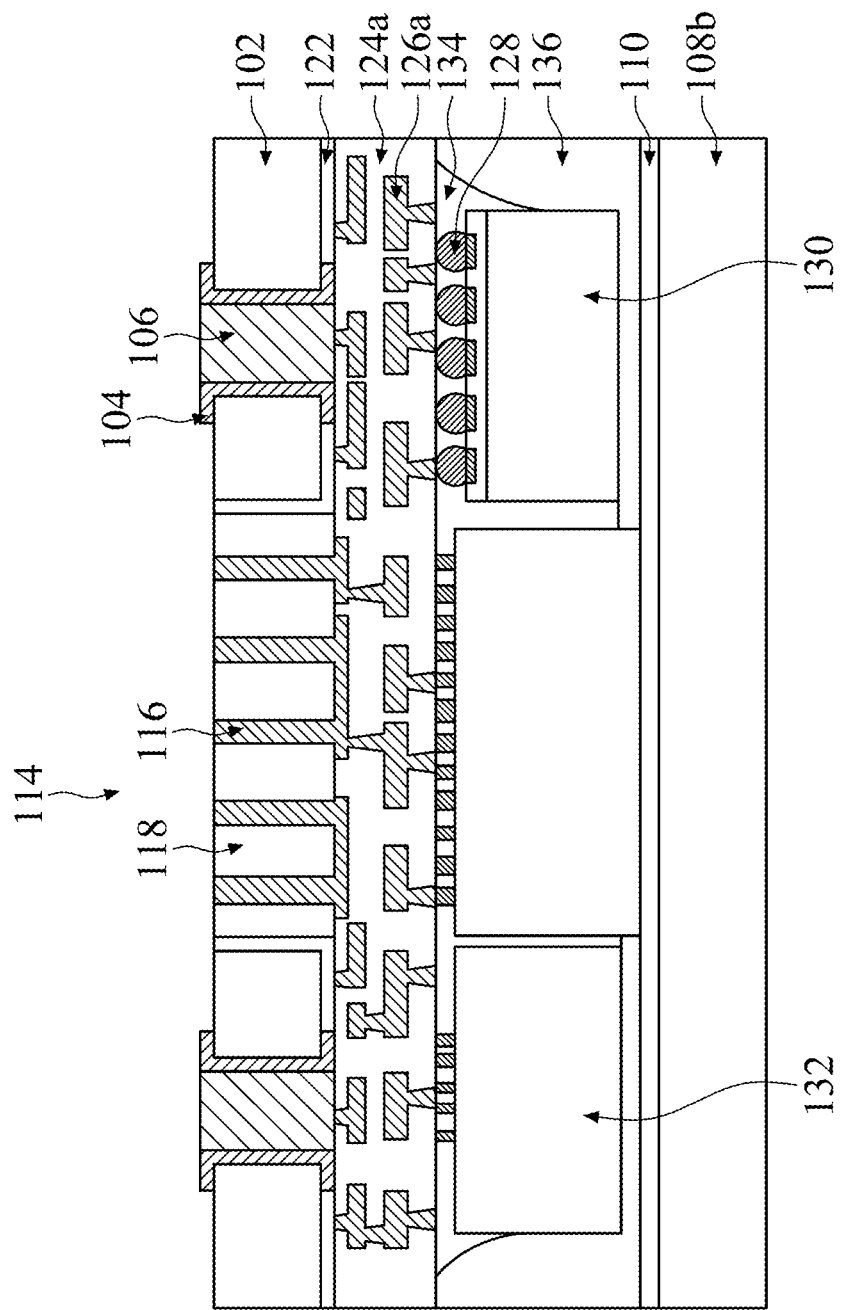

Afterwards, the first carrier substrate 108a and the buffer layer 110 are removed, and the structure of FIG. 1F is flipped, as shown in FIG. 1G, in accordance with some embodiments of the disclosure. As a result, the core substrate 102 and the first via structure 106 may face up and be exposed.

Next, the flipped structure of FIG. 1F is bonded to a second carrier substrate 108b by a buffer layer 110, as shown in FIG. 1G, in accordance with some embodiments of the disclosure. As shown in FIG. 1G, the package 130, the chip 132, and the second encapsulating material 136 are bonded to the second carrier substrate 108b.

The planarization process may be optionally performed, and the second carrier substrate 108b may be optionally formed. In some embodiments, the planarization process is not performed and the second encapsulating material 136 remains over the package 130 and the chip 132. After flipping the structure with second encapsulating material 136 formed over the package 130 and the chip 132, the second encapsulating material 136 may provide enough mechanical support for subsequently process, and the second carrier substrate 108b may not be formed.

Figure 1H:
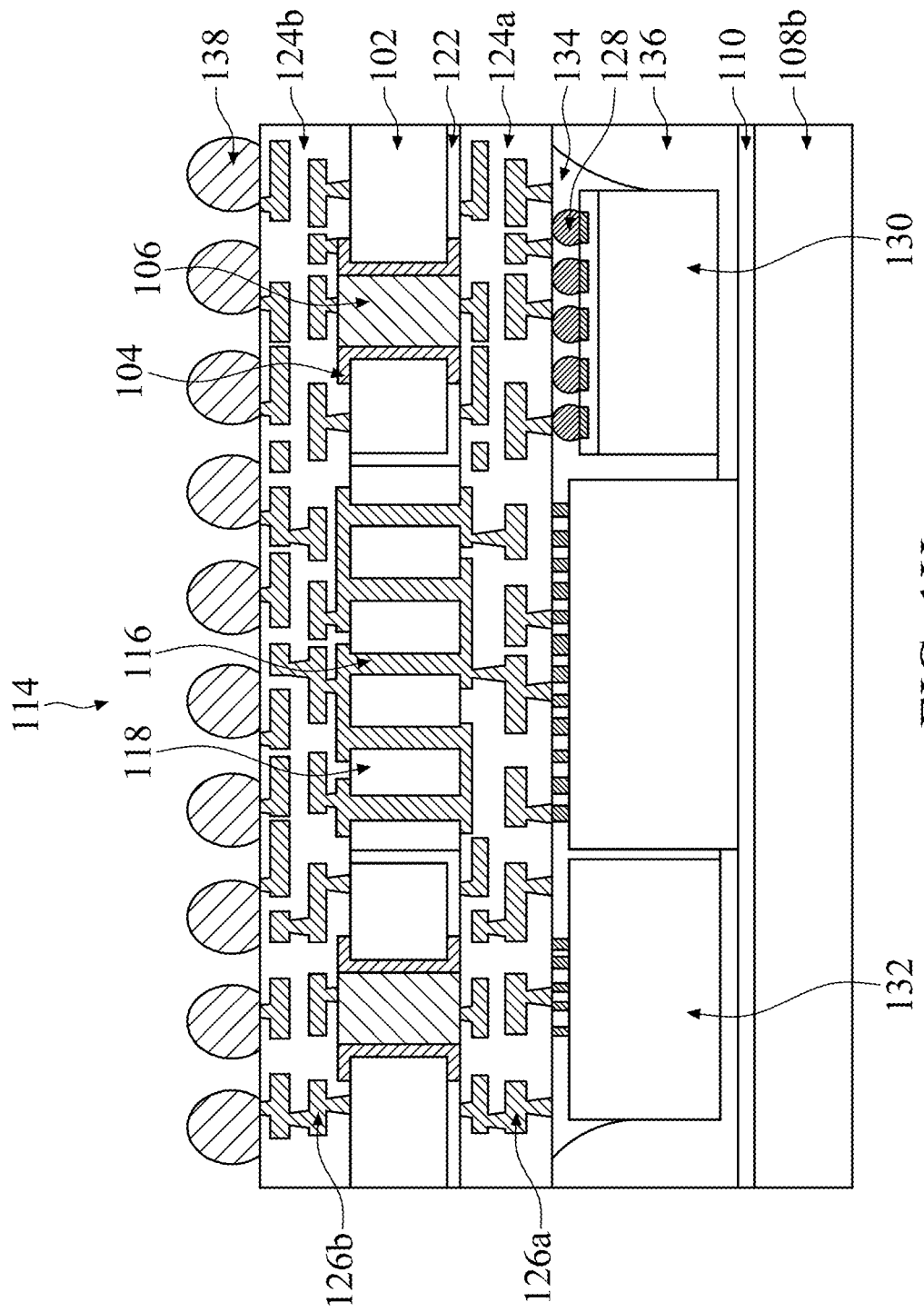

Next, a polymer layer 124b is formed over the core substrate 102 and a second redistribution layer structure 126b is formed over the polymer layer 124b and in the openings in the polymer layer 124b, as shown in FIG. 1H, in accordance with some embodiments of the disclosure. The polymer layer 124b and the second redistribution layer structure 126b may be repeated formed. Therefore, multiple redistribution layer structures 126b may be formed. The forming processes and material for forming the polymer layer 124b and the second redistribution layer structure 126b may be the same as, or similar to, those used when forming the polymer layer 124a and the first redistribution layer structure 126a. For the purpose of brevity, the descriptions of these processes are not repeated herein.

As shown in FIG. 1H, the core substrate 102 and the interposer 114 is sandwiched between the first redistribution layer structure 126a and the second redistribution layer structure 126b. As shown in FIG. 1H, the first via structure 106 in the core substrate 102 and the second via structure 116 of the interposer 114 are in contact with the first redistribution layer structure 126a and the second redistribution layer structure 126b. The first via structure 106 in the core substrate 102 and the second via structure 116 of the interposer 114 may be electrically connected to the first redistribution layer structure 126a and the second redistribution layer structure 126b.

Afterwards, a second electrical connector 138 is formed over the polymer layer 124b, as shown in FIG. 1H in accordance with some embodiments. The second electrical connector 138 may include solder ball, metal pillar, other applicable connectors, or a combination thereof. The second electrical connector 138 may be mounted to the second redistribution layer structure 126b. Therefore, the second electrical connector 138 may be in direct contact with second redistribution layer structure 126b and may be electrically connected to the second redistribution layer structure 126b.

Figure 1I:
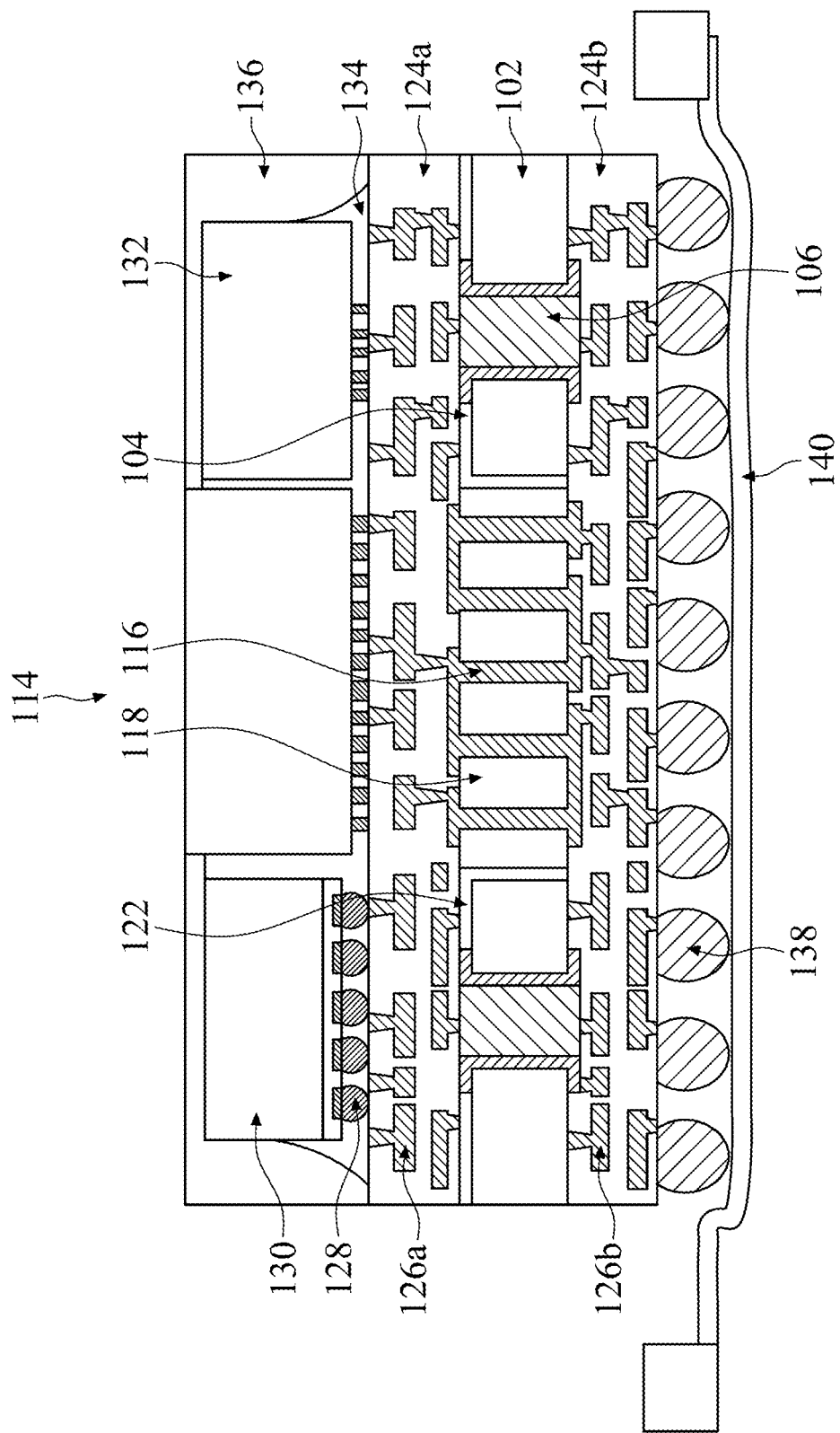

Afterwards, the second carrier substrate 108b and the buffer layer 110 are removed, and the structure of FIG. 1H is flipped and attached to a carrier 140, as shown in FIG. 1I in accordance with some embodiments of the disclosure. As a result, the package 130, the chip 132, and the second encapsulating material 136 may face up and be exposed. The carrier 140 may include a tape which is photosensitive or heat-sensitive and is easily detached from the second electrical connector 138.

Figure 1J:
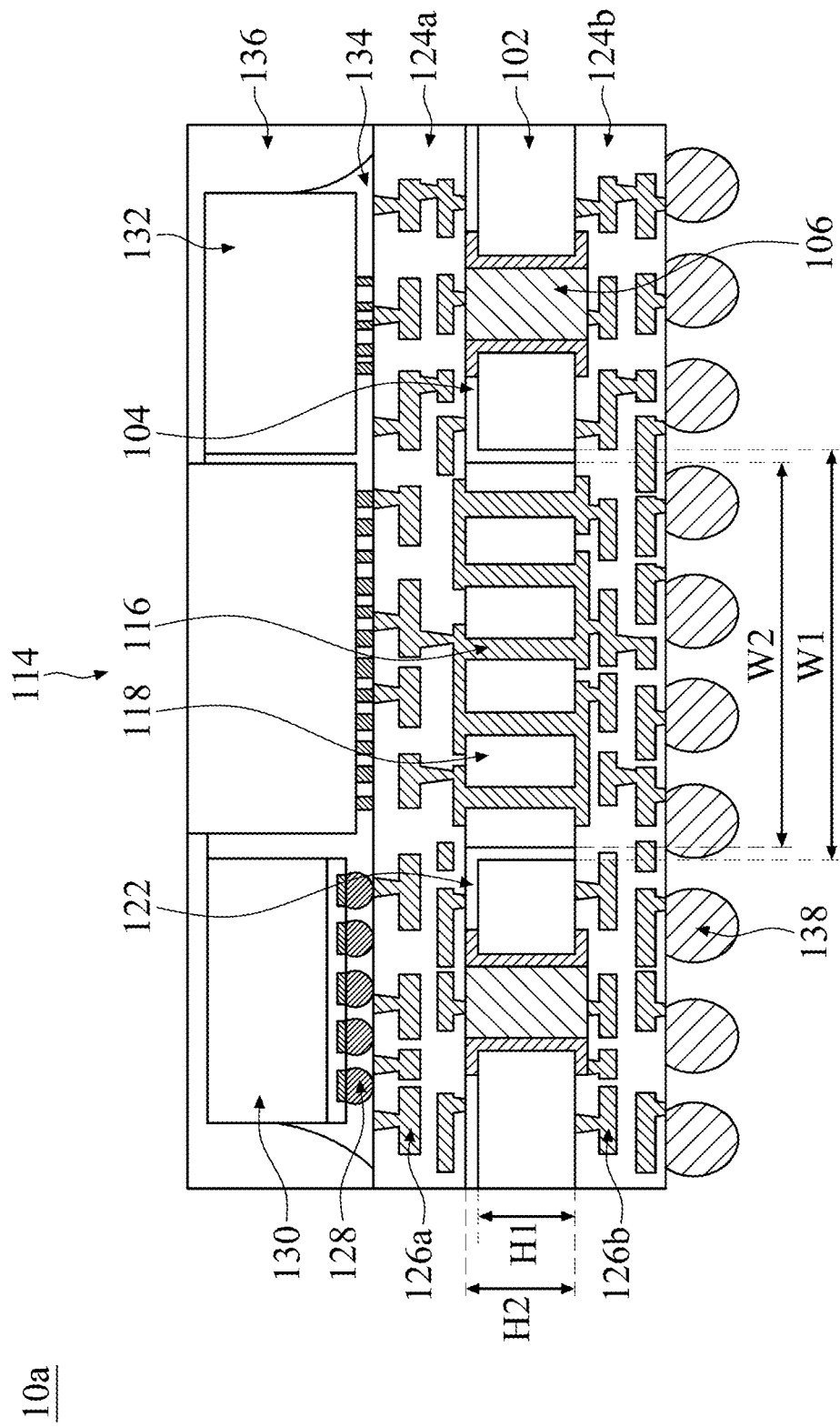

Afterwards, the structure as shown in FIG. 1I is detached from the carrier 140, and a semiconductor package structure 10a is formed as shown in FIG. 1J in accordance with some embodiments of the disclosure. A dicing process is performed to separate the semiconductor package structure into chip packages. FIG. 1J shows one example package after the dicing process.

Compared to cases where the interposer 114 and core substrate 102 are stacked on each other, the height of the semiconductor package structure 10a may be reduced with the interposer 114 embedded in the core substrate 102. In some embodiments, the height of the redistribution layer structures 126a and 126b is reduced by 60%. The power deliver efficiency may be improved with thinner semiconductor package structure 10a. In addition, the first redistribution structure layer 126a may land on different materials such as materials of the core substrate 102, the interposer substrate 118, and the first encapsulating layer 122. Therefore, heterogeneous interfaces between the first redistribution structure layer 126a and the core substrate 102, the interposer substrate 118, and the first encapsulating layer 122 may be formed.

Since the interposer 114 is embedded in the core substrate 102, the redistribution structure layers 126a and 126b may be formed on both side of the core substrate 102. Therefore, more routing flexibility may be provided.

As shown in FIG. 1J, the core substrate 102 has a height of H1, and the interposer 114 has a height of H2. In some embodiments, the height H1 of the core substrate 102 is in a range of about 50 µm to about 150 µm. If the height H1 of the core substrate 102 is too high, the power deliver efficiency may be worse. If the height H1 of the core substrate 102 is too low, the mechanical strength may not be enough. In some embodiments, the height ratio of the height H2 of the interposer 114 to the height H1 of the core substrate 102 to is in a range of about 1 to about 1.5. Therefore, the first encapsulating layer 122 is needed to fill in the space between the core substrate 102 and the first redistribution layer structure 126a.

As shown in FIG. 1J, the cavity 112 formed in the core substrate 102 has a width of W1, and the interposer 114 has a width of W2. In some embodiments, the width W1 of the cavity 112 in the core substrate 102 is greater than the width W2 of the interposer 114. Therefore, the interposer 114 may be disposed in the cavity 112, and the first encapsulating layer 122 may be filled between the sidewalls of interposer 114 and the core substrate 102. The first encapsulating layer 122 may surround the interposer 114. The interposer 114 may be embedded in the core substrate 102.

As shown in FIG. 2, the first via structure 106 has a width of d1, and the RDL via structure 125 has a width of d1'. In some embodiments, the first via structure 106 has a width of d1 in a range of about 30 µm to about 50 µm. If the width d1 of the first via structure 106 is too wide, the routing area may be increased. If the width d1 of the first via structure 106 is too narrow, it may be difficult for the first redistribution layer structure 126a to land over the first via structure 106. In some embodiments, the RDL via structure 125 has a width of d1' in a range of about 5 µm to about 10 µm. If the width d1' of the RDL via structure 125 is too wide, the routing area may be increased. If the width d1' of the RDL via structure 125 is too narrow, it may be difficult form the RDL via structure 125 and poor contact may be induced easily. As shown in FIG. 2, the width d1 of the first via structure 106 is greater than the width d1' of the RDL via structure 125. Therefore, it may be easier for the first redistribution layer structure 126a to land over the first via structure 106.

As shown in FIG. 3, the second via structure 116 has a width of d2, and the RDL pad 123 has a width of d2'. In some embodiments, the width d2 of the second via structure 116 is in a range of about 10 µm to about 50 µm. If the width d2 of the second via structure 116 is too wide, the stress caused by the second via structure 116 may be too great, and the conductive material in the second via structure 116 may protrude out in the following process. If the width d2 of the second via structure 116 is too narrow, if may be difficult to form the second via structure 116. As shown in FIG. 3, the width d2 of the second via structure 116 is less than the width d2' of the RDL pad 123. With the RDL pad 123, it may be easier for the first redistribution layer structure 126a to land over the second via structure 116.

Since the width d1 of the first via structure 106 and the width d2 of the second via structure 116 are different, different RDL structures such as the RDL via structure 125 and the RDL pad 123 may be formed to make the landing of the first redistribution layer structure 126a easier.

By disposing an interposer 114 in the core substrate 102, more input/output (I/O) terminals for die integration is provided. Since the height of the semiconductor package structure is reduced, the power deliver efficiency may be improved. In addition, the rigidity of the interposer substrate 118 is higher than the core substrate 102, preventing warpage.

Figure 4:
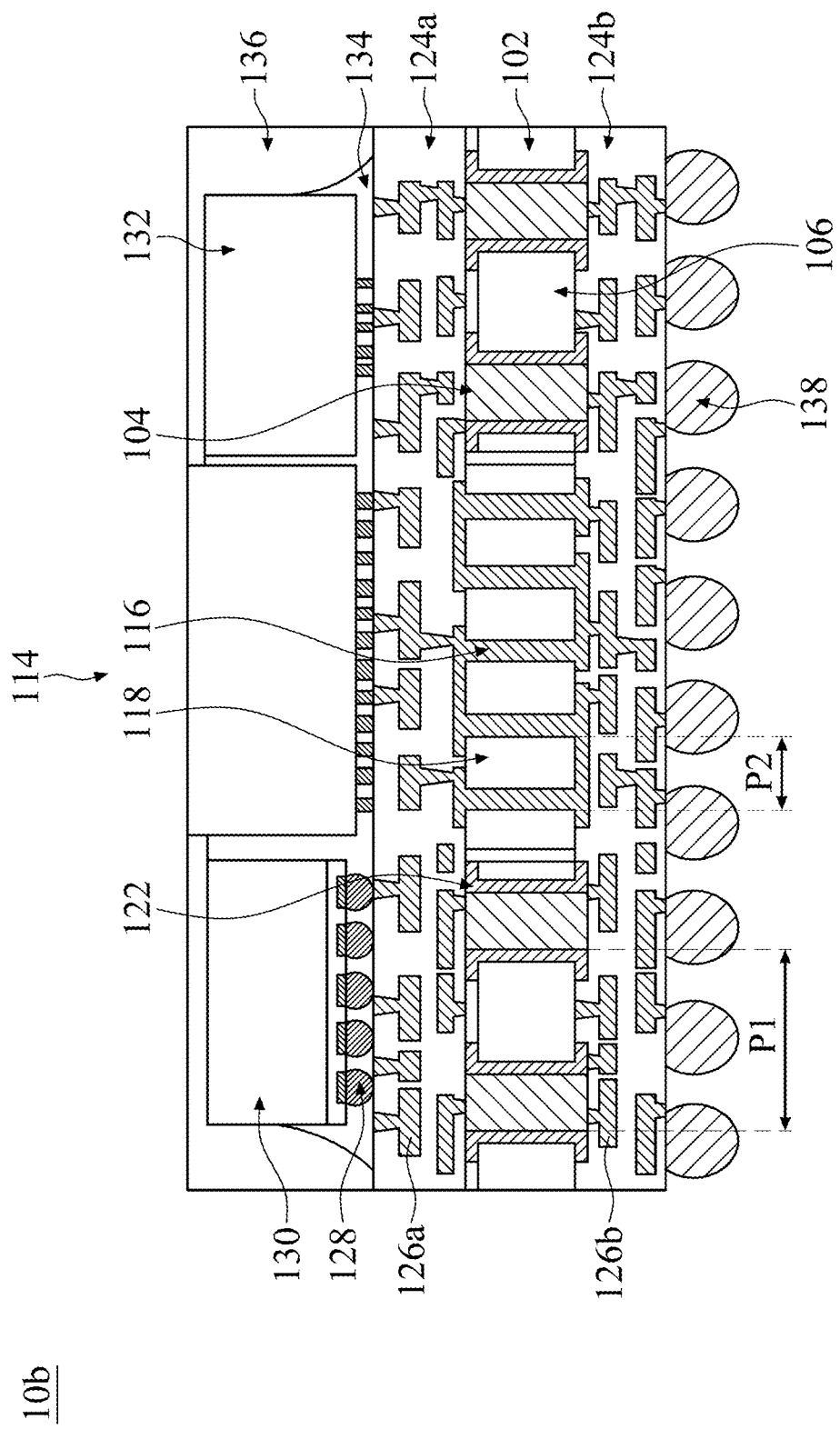
FIG. 4 is a cross-sectional view of a modified semiconductor package structure, in accordance with some embodiments of the disclosure.

Many variations and/or modifications may be made to the embodiments of the disclosure. FIG. 4 is a cross-sectional view of a modified semiconductor package structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4 in accordance with some embodiments, the number of the first via structures 106 has increased.

As shown in FIG. 4, the first via structures 106 in the core substrate 102 has a pitch P1, and the second via structures 116 of the interposer 114 has a pitch P2. In some embodiments, the pitch P1 of the first via structures 106 in the core substrate 102 and the pitch P2 of the second via structures 116 of the interposer 114 are different. In some embodiments, the pitch P1 of the first via structures 106 in the core substrate 102 is greater than the pitch P2 of the second via structures 116 of the interposer 114. Therefore, the interposer 114 embedded in the core substrate 102 may provide a mixed pitch vertical interconnection without increasing the routing area. In some embodiments, the ratio of the pitch P1 of the first via structures 106 in the core substrate 102 to the pitch P2 of the second via structures 116 of the interposer 114 is in a range of around 1.5 to around 4. If the ratio of the pitch P1 of the first via structures 106 to the pitch P2 of the second via structures 116 is too high, the interposer area may be reduced, and the rigidity may be poor. In addition, more routing layers of RDL structures in the interposer 114 may be needed to match the input/output terminal of the package 130 and the chip 132. If the ratio of the pitch P1 of the first via structures 106 to the pitch P2 of the second via structures 116 is too low, more routing layers of RDL structures in the interposer 114 may be needed to match the input/output terminal of the package 130 and the chip 132.

It should be noted that the number of via structures 106 and 116 is merely an example, and the present disclosure is not limited thereto. The number of via structures 106 and 116 may be any suitable numbers, depending on the demands of routing.

By disposing an interposer 114 in the core substrate 102, more input/output (I/O) terminals for die integration is provided. Since the height of the semiconductor package structure is reduced, the power deliver efficiency may be improved. In addition, the rigidity of the interposer substrate 118 is higher than the core substrate 102, preventing warpage. The interposer 114 and the core substrate 102 may provide mixed pitch for vertical interconnection, and the routing area may remain the same.

Figure 5:
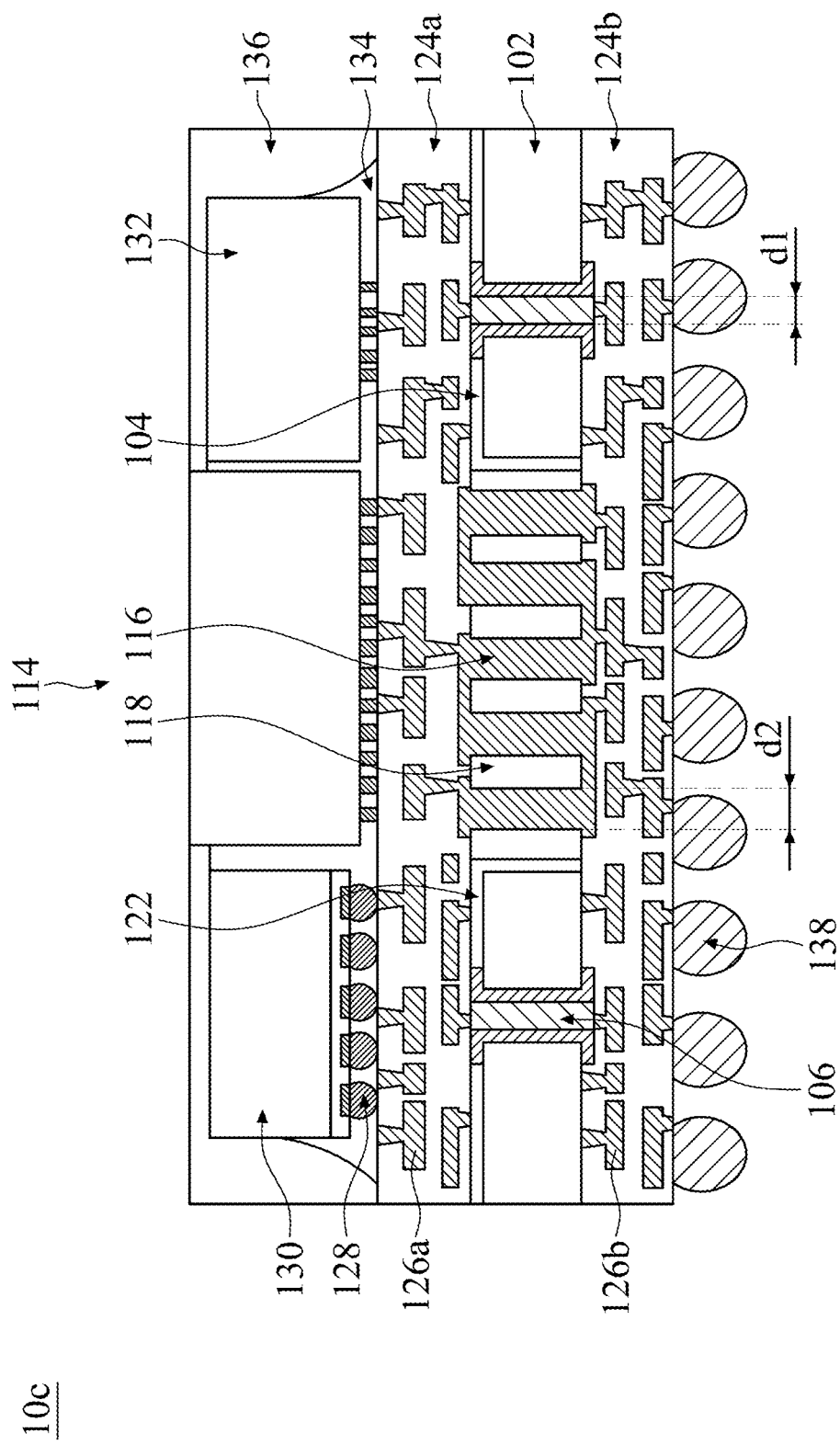
FIG. 5 is a cross-sectional view of a modified semiconductor package structure, in accordance with some embodiments of the disclosure.

Many variations and/or modifications may be made to the embodiments of the disclosure. FIG. 5 is a cross-sectional view of a modified semiconductor package structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5 in accordance with some embodiments, the width d1 of the first via structure 106 in the core substrate 102 is less than the width d2 of the second via structure 116 of the interposer 114.

In some embodiments, the ratio of the width d1 of the first via structure 106 in the core substrate 102 to the width d2 of the second via structure 116 of the interposer 114 is around 0.7 to around 4. If the ratio of the width d1 of the first via structure 106 to the width d2 of the second via structure 116 of the interposer 114 is too high, it may reduce the number of input/output terminals and further impact on the input/output terminals of corresponding stacked chip 132. If the ratio of the width d1 of the first via structure 106 to the width d2 of the second via structure 116 of the interposer 114 is too low, it may need more area for interposer 114 to meet the input/output terminals routing requirement the width d1 of the first via structure 106 in the core substrate 102 may be less than the width d2 of the second via structure 116 of the interposer 114, depending on the demands of routing.

By disposing an interposer 114 in the core substrate 102, more input/output (I/O) terminals for die integration is provided. Since the height of the semiconductor package structure is reduced, the power deliver efficiency may be improved. In addition, the rigidity of the interposer substrate 118 is higher than the core substrate 102, preventing warpage. The ratio of the widths of the via structures 106 and 116 may be modified, depending on the demands of routing.

Figure 6A:
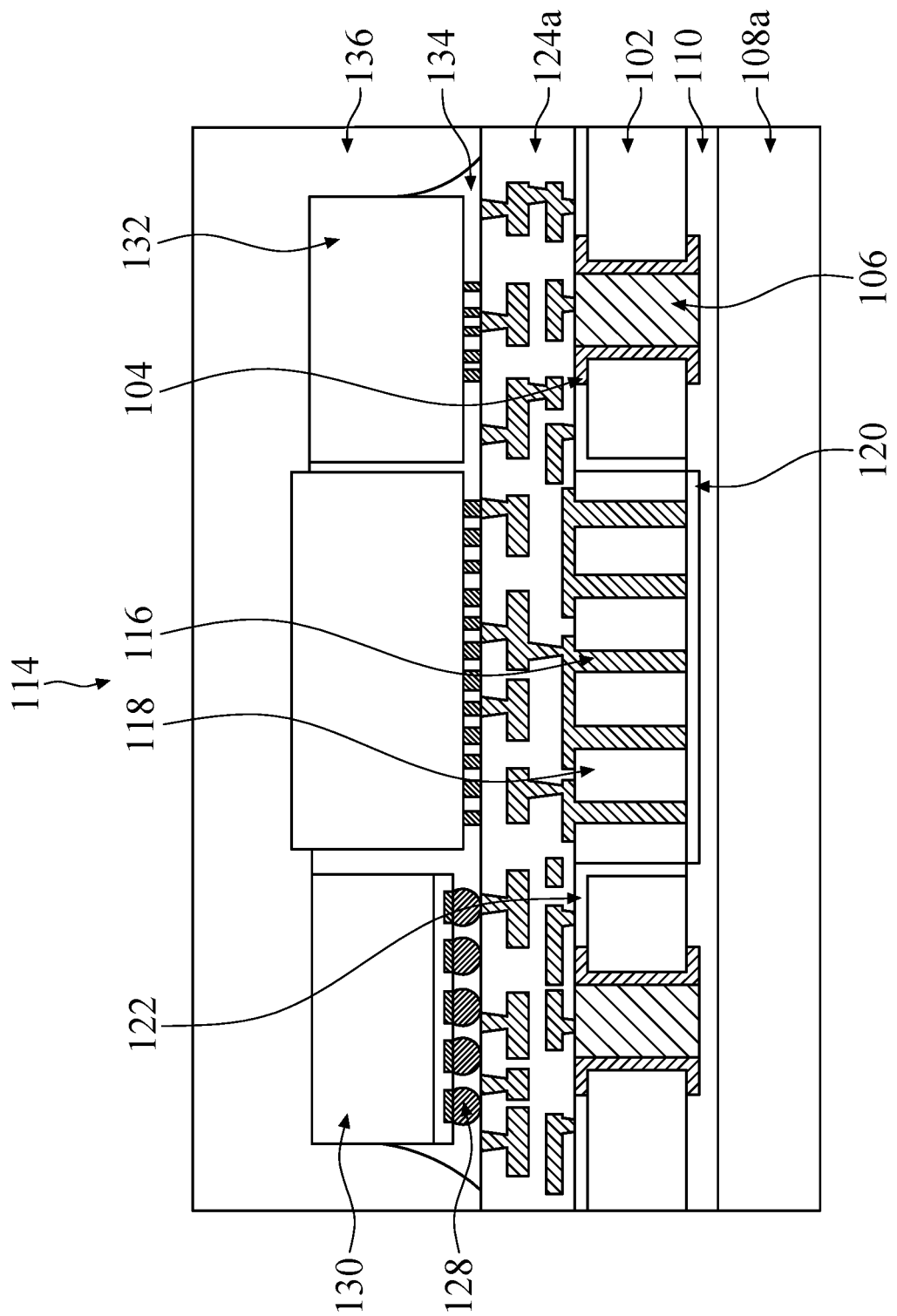
FIGS. 6A-6C are cross-sectional representations of various stages of forming a modified semiconductor package structure, in accordance with some embodiments of the disclosure.
Figure 6B:
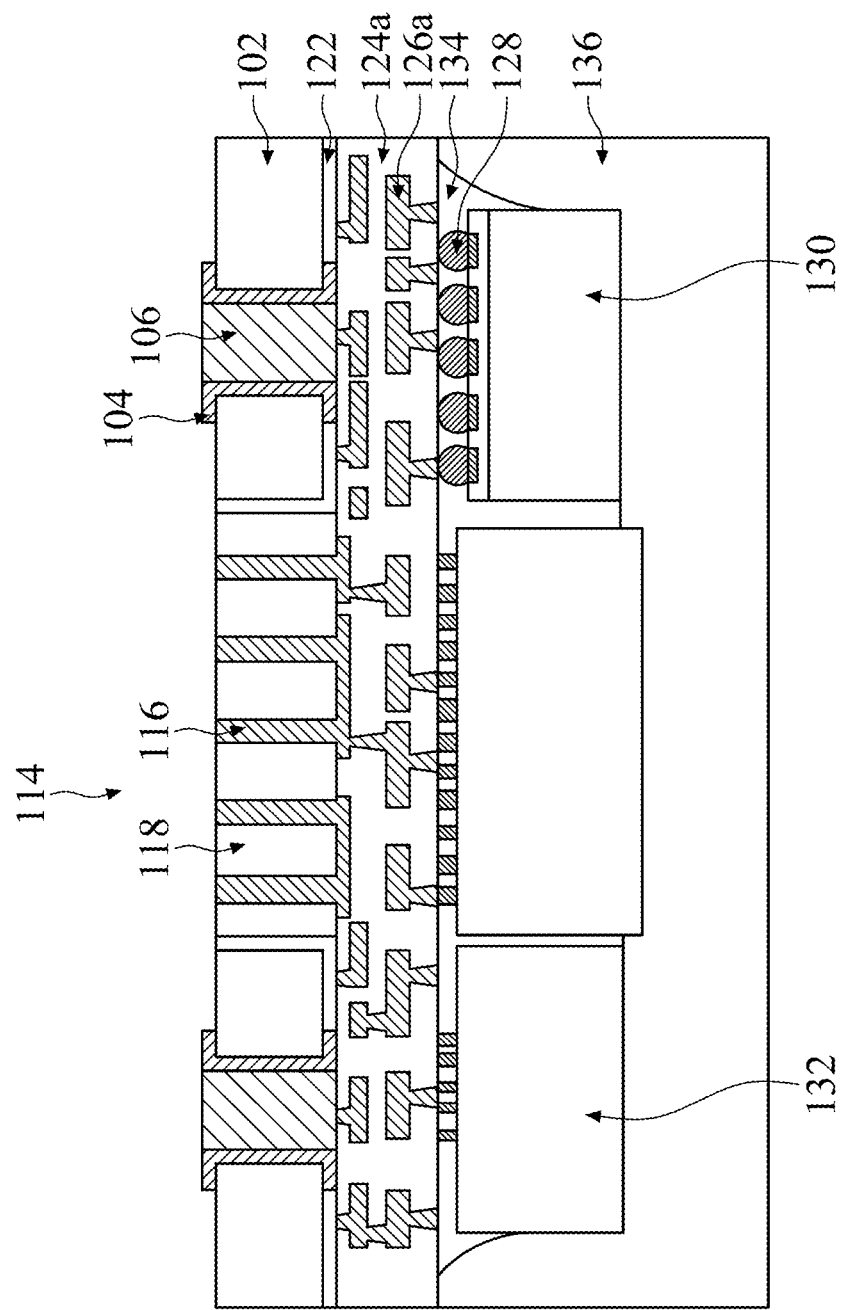
Figure 6C:
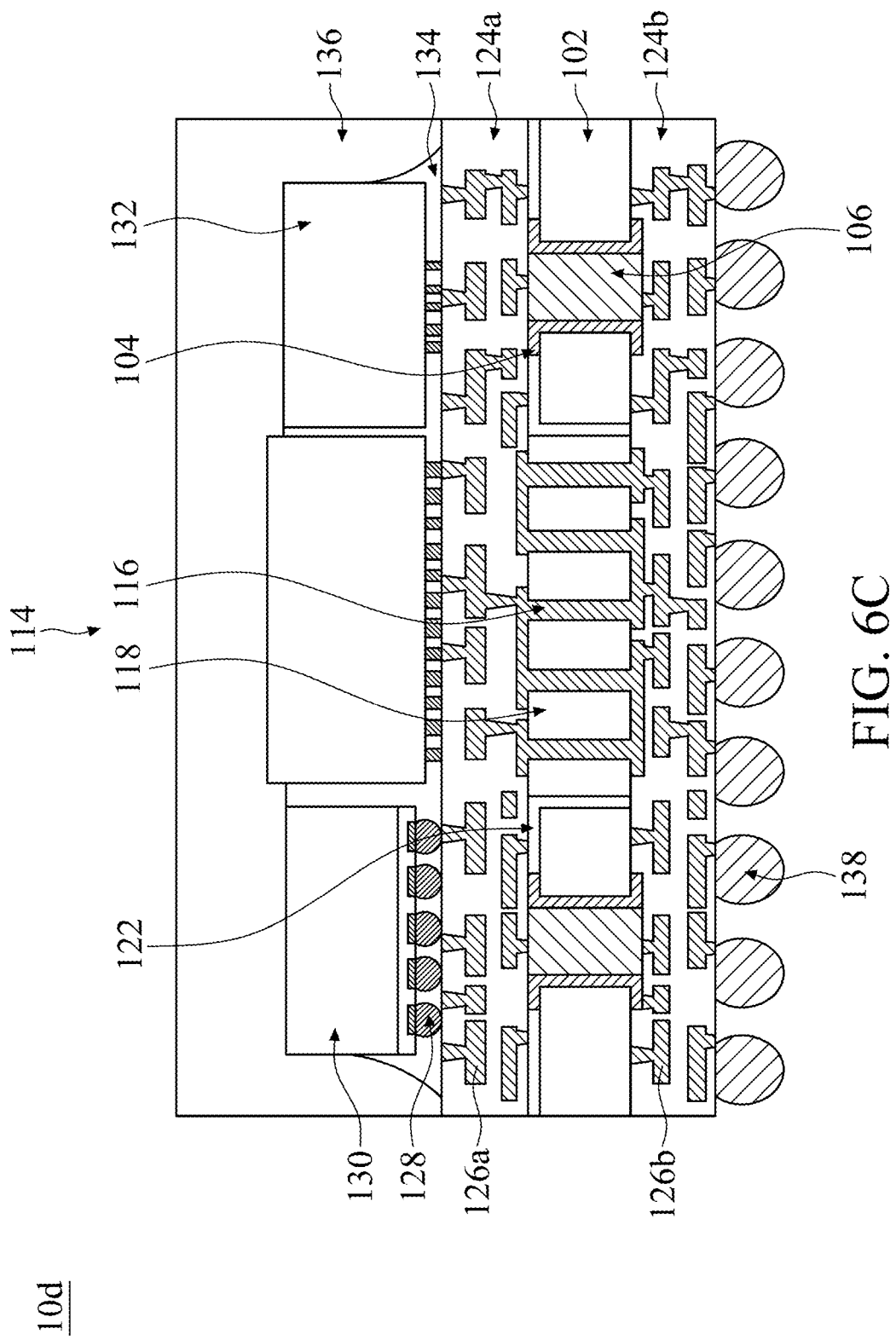

Many variations and/or modifications may be made to the embodiments of the disclosure. FIGS. 6A-6C are cross-sectional representations of various stages of forming a semiconductor package structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 6A in accordance with some embodiments, the second encapsulating layer 136 covers the top surfaces of the package 130 and the chip 132.

As shown in FIG. 6A, after forming the second encapsulating layer 136 over the package 130 and the chip 132, the top surface of the second encapsulating layer 136 is flat. Therefore, the following planarization process may be skipped.

Next, the structure shown in FIG. 6A is flipped, as shown in FIG. 6B in accordance with some embodiments of the disclosure. The mechanical strength second encapsulating layer 136 provides may be enough for the following process, and it may not be necessary to bond the structure shown in FIG. 6B to the second carrier substrate 108b. Therefore, the cost and time required for production may be reduced.

By disposing an interposer 114 in the core substrate 102, more input/output (I/O) terminals for die integration is provided. Since the height of the semiconductor package structure is reduced, the power deliver efficiency may be improved. In addition, the rigidity of the interposer substrate 118 is higher than the core substrate 102, preventing warpage. Since the top surface of the second encapsulating layer 136 is flat, the subsequent planarization process and bonding process to the second carrier substrate 108b may be skipped. Therefore, the cost and time required for production may be reduced.

Figure 7A:
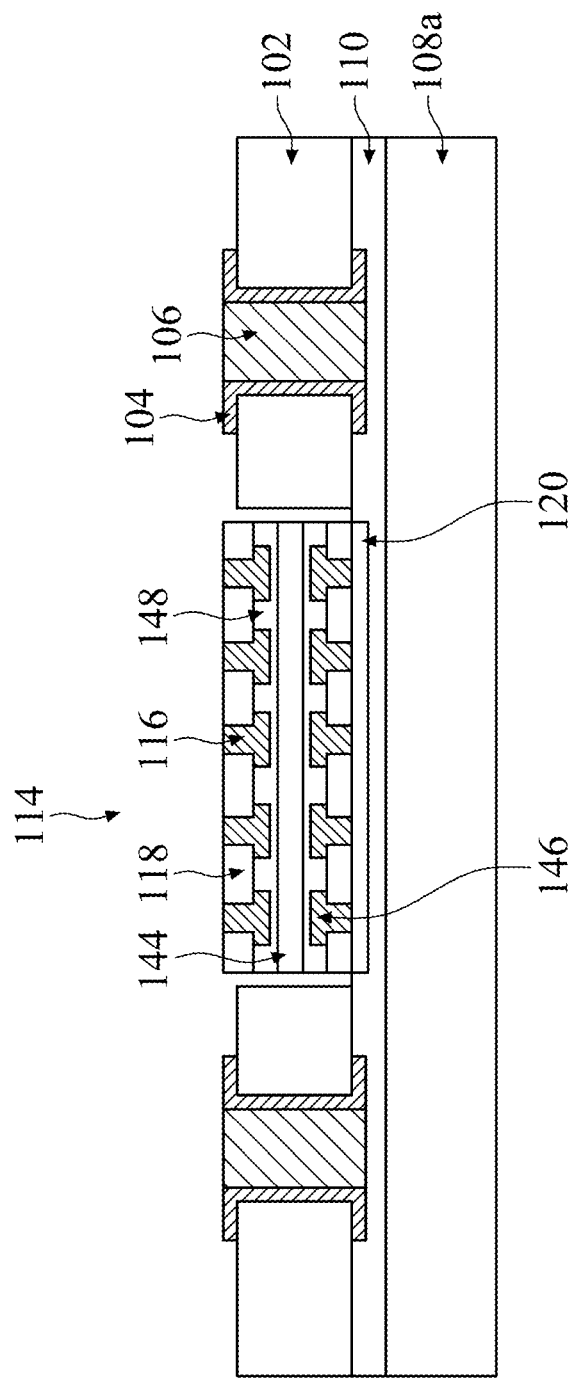
FIGS. 7A-7B are cross-sectional representations of various stages of forming a modified semiconductor package structure, in accordance with some embodiments of the disclosure.
Figure 7B:
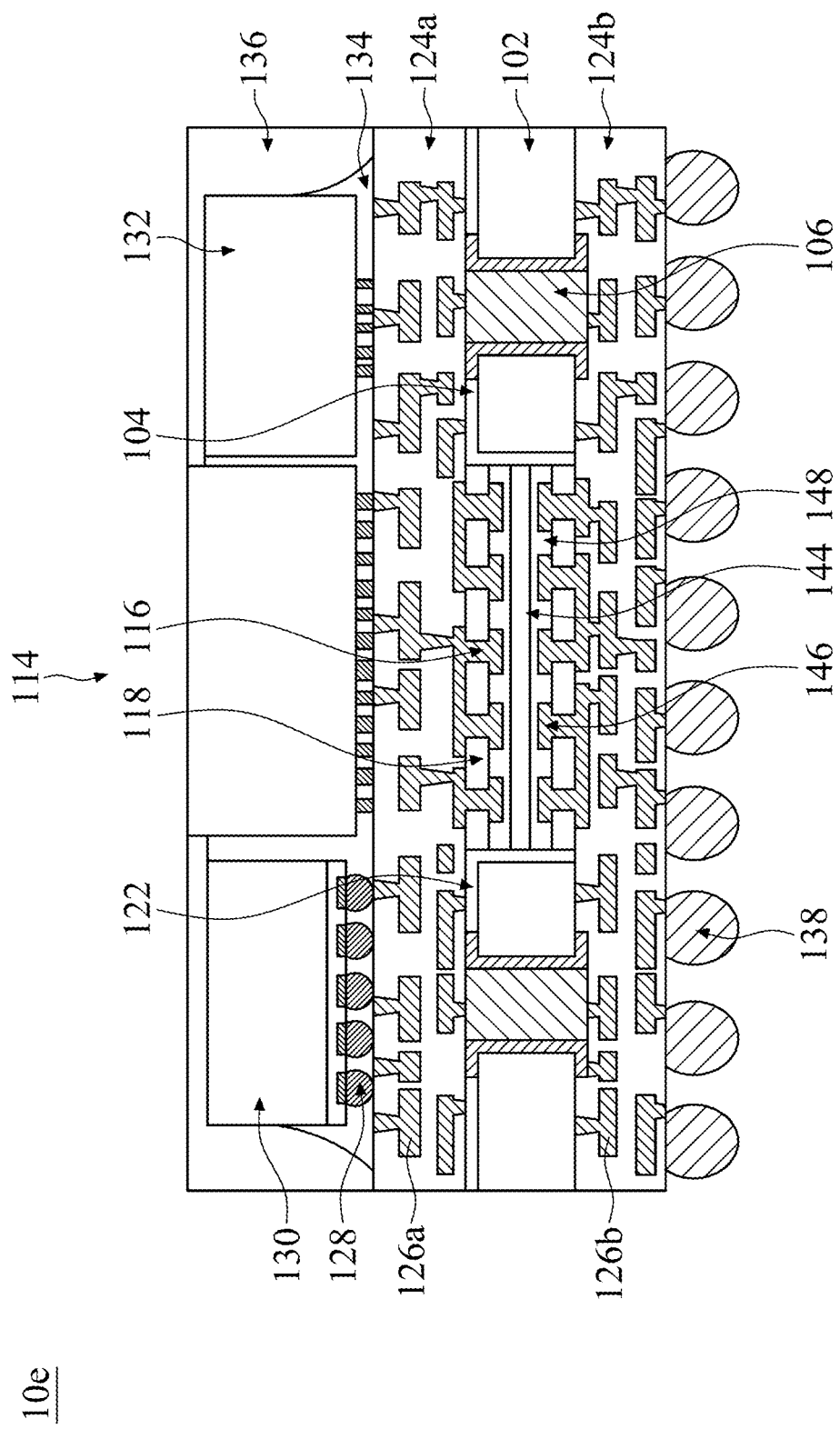

Many variations and/or modifications may be made to the embodiments of the disclosure. FIGS. 7A-7B are cross-sectional representations of various stages of forming a semiconductor package structure 10e, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 7A in accordance with some embodiments, the interposer 114 includes an active device 144.

As shown in FIG. 7A, a conductive pad 146 is formed over both sides of the active device 144, and a passivation layer 148 may be conformally formed over the conductive pad 146 and the active device 144. The forming processes and material for forming the conductive pad 146 and the passivation layer 148 may be the same as, or similar to, those used when forming the RDL pad 123 and the passivation layer 124. For the purpose of brevity, the descriptions of these processes are not repeated herein.

The active device 144 may be multiple active devices 144 bonded face to face by bumps (not shown). The bumps may be controlled collapse chip connection (C4) bumps. The bumps may provide electrical connection between the multiple active devices 144. The bumps may be made of a solder material, such as Sn, Ag, Au, or another suitable conductive material. The bumps may be formed by evaporation, electroplating, solder transfer, other suitable process, or a combination thereof.

The via structure 116 may be formed through the active device 144 in the interposer 114, with polymer layers or dielectric layers formed surrounding the via structure 116 (not shown). The polymer layers or dielectric layers formed surrounding the via structure 116 may enhance the mechanical strength. The via structure 116 may be electrically connected to the bumps connecting the multiple active devices 144.

The via structure 116 electrical connecting to the active device 144 is electrically connected to the redistribution layer structures 126a and 126b, as shown in FIG. 7B in accordance with some embodiments.

By disposing an interposer 114 in the core substrate 102, more input/output (I/O) terminals for die integration is provided. Since the height of the semiconductor package structure is reduced, the power deliver efficiency may be improved. In addition, the rigidity of the interposer substrate 118 is higher than the core substrate 102, preventing warpage. The interposer 114 may also include an active device 144, depending on design demands.

Figure 8A:
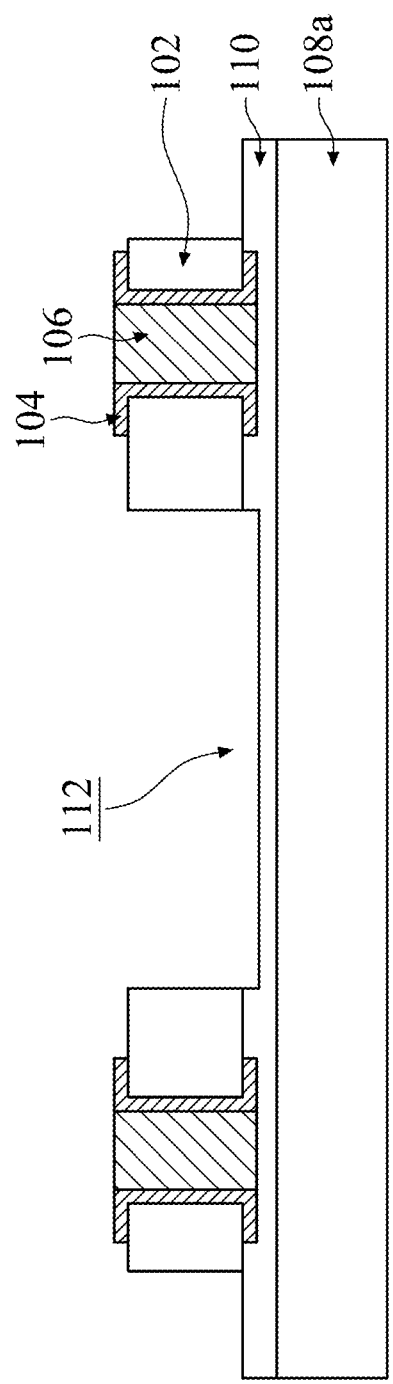
FIGS. 8A-8C are cross-sectional representations of various stages of forming a modified semiconductor package structure, in accordance with some embodiments of the disclosure.
Figure 8B:
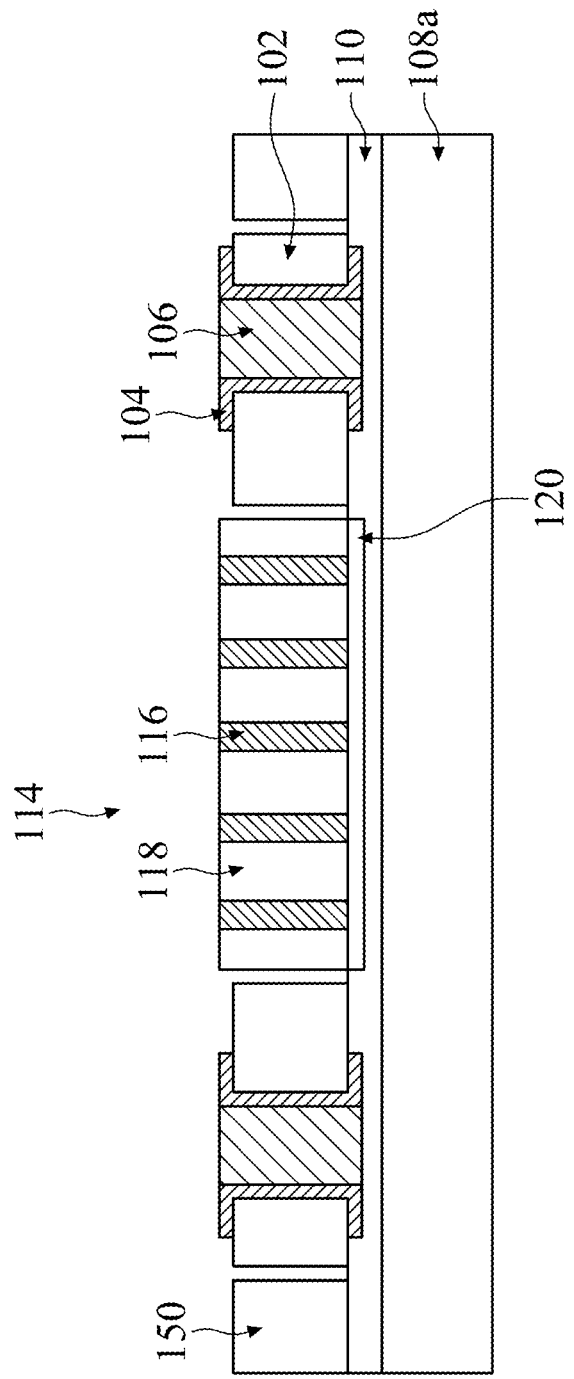
Figure 8C:
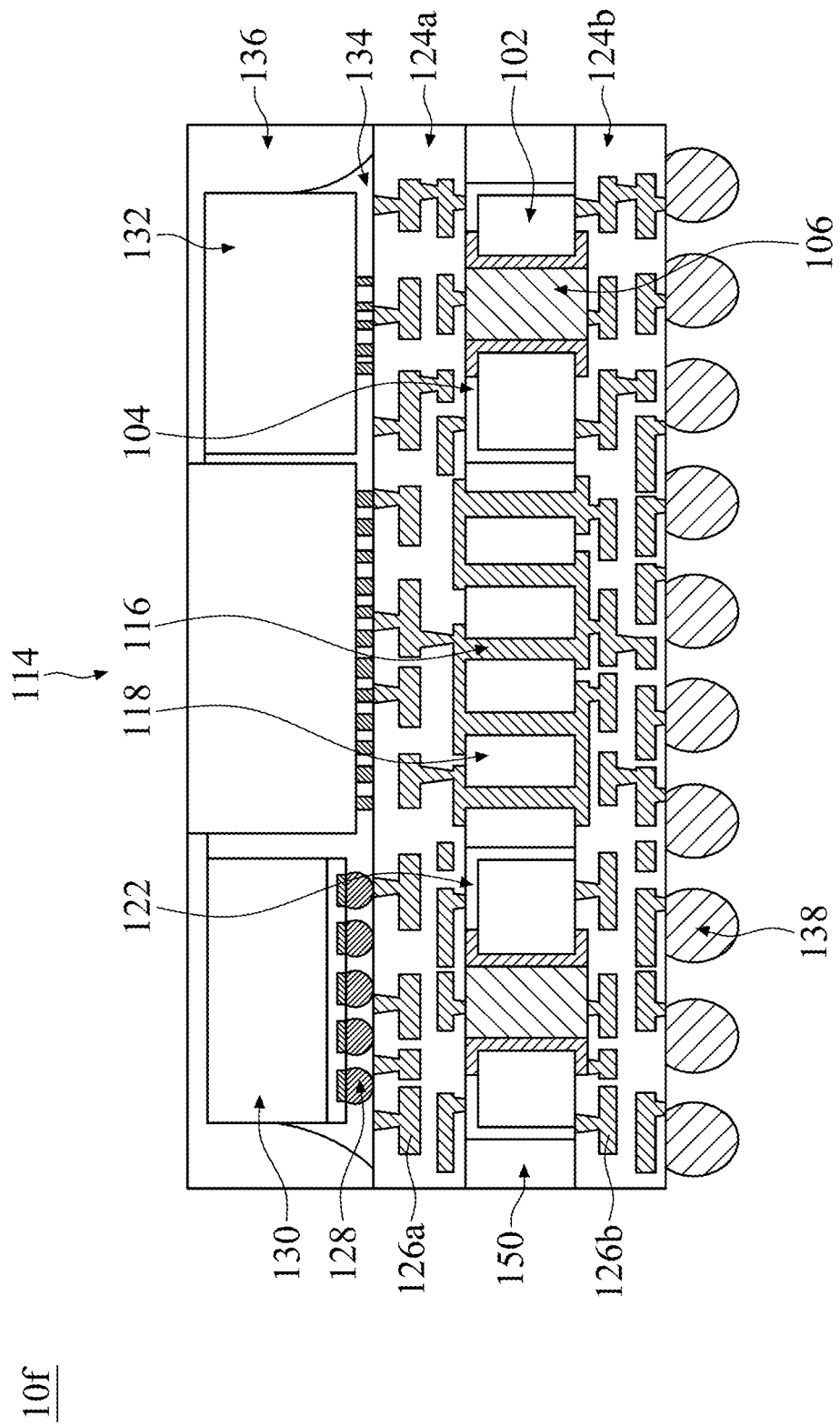

Many variations and/or modifications may be made to the embodiments of the disclosure. FIGS. 8A-8C are cross-sectional representations of various stages of forming a semiconductor package structure 10f, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 8A in accordance with some embodiments, multiple cavities 112 are formed in the core substrate 102 beside the first via structure 106.

As shown in FIG. 8B, a dummy substrate 150 is disposed in the cavities 112 without the interposer 114. The forming processes and material for forming the dummy substrate 150 may be the same as, or similar to, those used when forming the interposer substrate 118. For the purpose of brevity, the descriptions of these processes are not repeated herein. In some embodiments, the materials of the dummy substrate 150 and the interposer substrate 118 are the same. Therefore, the rigidity of the dummy substrate 150 and the interposer substrate 118 may be substantially the same.

As shown in FIG. 8B, there is no via structure 116 in the dummy substrate 150. Since the dummy structure 150 also has greater rigidity, the dummy structure 150 may also minimize the warpage of the substrate 102.

As shown in FIG. 8C, the first encapsulating layer 122 fills in a space between the core substrate 102 and the dummy structure 150. In some embodiments, the height of the dummy structure 150 is substantially the same as the height of the interposer 114. As shown in FIG. 8C, the dummy structure 150 is in direct contact with the polymer layers 124a and 124b without electrically connect with the redistribution layer structures 126a and 126b.

By disposing an interposer 114 in the core substrate 102, more input/output (I/O) terminals for die integration is provided. Since the height of the semiconductor package structure is reduced, the power deliver efficiency may be improved. In addition, the rigidity of the interposer substrate 118 is higher than the core substrate 102, preventing warpage. With a dummy substrate 150 made of the same material as the interposer substrate 118, the rigidity of the semiconductor package structure may be increased, and warpage may be minimized.

As described previously, disposing an interposer 114 in the core substrate 102 may provide mixed pitch vertical interconnection without increasing the routing area. The height of semiconductor package structure may be reduced, and the power deliver efficiency may be improved. There may be more I/O terminals for die integration. The substrate warpage issue may also be minimized due to greater rigidity of the interposer substrate 118. In the embodiments illustrated in FIG. 4, there are multiple first via structures 106 formed in the core substrate 102. In the embodiments illustrated in FIG. 5, the second via structure 116 of the interposer 114 is wider than the first via structure 106 in the core substrate 102. In the embodiments illustrated in FIGS. 6A-6C, the second encapsulating layer 136 is formed over the package 130 and the chip 132. The structure does not need to be bonded to the second carrier substrate 108b since the encapsulating layer 136 provides sufficient strength. In the embodiments illustrated in FIGS. 7A-7B, the interposer 114 includes an active device 144, providing more design flexibility. In the embodiments illustrated in FIGS. 8A-8C, the dummy substrate 150 with greater rigidity is also embedded in the core substrate 102, and the substrate warpage issue may be further minimized.

Embodiments of a semiconductor package structure and a method for forming the same are provided. The semiconductor package structure includes interposer disposed in the core substrate. A mixed pitch vertical interconnection without increasing routing area is provided. The height of the semiconductor package structure may be reduced, and the power deliver efficiency may be improved. There may be more I/O terminals for die integration. The substrate warpage may be minimized due to the rigidity of the interposer substrate.

In some embodiments, a semiconductor package structure is provided. The semiconductor package structure includes first via structures formed through a core substrate. The semiconductor package structure also includes an interposer embedded in the core substrate between the first via structures. The interposer comprises second via structures formed through an interposer substrate. The semiconductor package structure also includes a first redistribution layer structure formed over the core substrate. The semiconductor package structure also includes a second redistribution layer structure formed under the core substrate. The semiconductor package structure also includes a first encapsulating layer formed between a sidewall of the interposer and a sidewall of the core substrate.

In some embodiments, a semiconductor package structure is provided. The semiconductor package structure includes a first substrate sandwiched between the top redistribution layer structure and the bottom redistribution layer structure. The semiconductor package structure also includes first via structures formed in the first substrate electrically connected to the top redistribution layer structure and the bottom redistribution layer structure. The semiconductor package structure also includes a second substrate disposed in the first substrate. The semiconductor package structure also includes second via structures formed in the second substrate electrically connected to the top redistribution layer structure and the bottom redistribution layer structure. The semiconductor package structure also includes an encapsulating layer surrounding the second substrate and covering the first substrate between the top redistribution layer structure and the bottom redistribution layer structure.

In some embodiments, a method for forming a semiconductor package structure is provided. The method for forming a semiconductor package structure includes forming a first via structure in a substrate. The method for forming a semiconductor package structure also includes forming a cavity in the substrate beside the first via structure. The method for forming a semiconductor package structure also includes attaching an interposer in the cavity. The method for forming a semiconductor package structure also includes filling a first encapsulating material surrounding the interposer and over the substrate. The method for forming a semiconductor package structure also includes planarizing the first encapsulating material to expose the top surface of the first via structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor package structure, comprising:
   forming a first via structure in a substrate;
   forming a cavity in the substrate beside the first via structure;
   attaching an interposer in the cavity;
   filling a first encapsulating material surrounding the interposer and over the substrate;
   planarizing the first encapsulating material to expose a top surface of the first via structure;
   forming a first redistribution layer structure over the substrate; and
   forming a second redistribution layer structure under the substrate.

2. The method for forming the semiconductor package structure as claimed in claim 1, wherein a width of the cavity is wider than a width of the interposer.

3. The method for forming the semiconductor package structure as claimed in claim 1,
   wherein the first redistribution layer structure and the second redistribution layer structure are in contact with the first via structure.

4. The method for forming the semiconductor package structure as claimed in claim 3, further comprising:
   forming a chip over the first redistribution layer structure; and
   forming a second encapsulating material covering the chip.

5. The method for forming the semiconductor package structure as claimed in claim 4, further comprising:
   planarizing the second encapsulating material to expose a top surface of the chip.

6. The method for forming the semiconductor package structure as claimed in claim 3, further comprising:
   bonding the substrate over a first carrier substrate before forming the cavity; and
   flipping the substrate and removing the first carrier substrate before forming the second redistribution layer structure.

7. The method for forming the semiconductor package structure as claimed in claim 6, further comprising:
   forming a chip over the first redistribution layer structure;
   bonding the chip to a second carrier substrate after flipping the substrate;
   mounting an electrical connector under the second redistribution layer structure; and
   removing the second carrier substrate.

8. A method for forming a semiconductor package structure, comprising:
   forming a first via structure and a first cavity in a substrate;
   forming a dummy substrate in the substrate and adjacent to the first via structure;
   forming an interposer with a second via structure in the first cavity;
   filling the first cavity with an encapsulating material; and
   forming a redistribution layer structure over the substrate and electrically connected to the first via structure and the second via structure.

9. The method for forming the semiconductor package structure as claimed in claim 8, further comprising:
   forming a second cavity in the substrate;
   forming the dummy substrate in the second cavity; and
   filling the second cavity with the encapsulating material.

10. The method for forming the semiconductor package structure as claimed in claim 8, wherein a top surface of the dummy substrate is coplanar with a top surface of the interposer, and a bottom surface of the dummy substrate is coplanar with a bottom surface of the interposer.

11. The method for forming the semiconductor package structure as claimed in claim 8, wherein the redistribution layer structure is in contact with the dummy substrate.

12. The method for forming the semiconductor package structure as claimed in claim 8, wherein the interposer and the dummy substrate include a same material.

13. The method for forming the semiconductor package structure as claimed in claim 8, wherein a width of the first via structure is greater than a width of the second via structure.

14. The method for forming the semiconductor package structure as claimed in claim 8, further comprising:
   forming a second redistribution layer structure under the substrate and electrically connected to the first via structure and the second via structure.

15. A method for forming a semiconductor package structure, comprising:
   forming via structures in a substrate;
   forming an interposer in the substrate between the via structures;
   forming an encapsulating material from a bottom surface of the substrate to a top surface of the substrate along a sidewall of the interposer;
   forming a first redistribution layer structure in contact with the interposer and the encapsulating material; and
   forming a second redistribution layer structure in contact with a bottom surface of the interposer.

16. The method for forming the semiconductor package structure as claimed in claim 15, wherein the encapsulating material covers the top surface of the substrate and surrounds the via structures.

17. The method for forming the semiconductor package structure as claimed in claim 15, wherein forming the second redistribution layer structure after forming the first redistribution layer structure.

18. The method for forming the semiconductor package structure as claimed in claim 15, further comprising:
   bonding the substrate over a carrier substrate by a buffer layer;
   forming the interposer over the buffer layer by an adhesive layer; and
   removing the adhesive layer, the buffer layer, and the carrier substrate after forming the first redistribution layer structure.

19. The method for forming the semiconductor package structure as claimed in claim 15, further comprising:
   forming dummy substrates adjacent to the via structures.

20. The method for forming the semiconductor package structure as claimed in claim 19, wherein each of heights of the interposer and the dummy substrates is greater than a height of the substrate.

* * * * *